(12) United States Patent
Tabata et al.

(10) Patent No.: US 10,297,423 B2
(45) Date of Patent: May 21, 2019

(54) PLASMA GENERATION APPARATUS, CVD APPARATUS, AND PLASMA-TREATED PARTICLE GENERATION APPARATUS

(75) Inventors: Yoichiro Tabata, Tokyo (JP); Kensuke Watanabe, Tokyo (JP)

(73) Assignee: TOSHIBA MITSUBISHI—ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 890 days.

(21) Appl. No.: 14/131,345

(22) PCT Filed: Apr. 23, 2012

(86) PCT No.: PCT/JP2012/060846
§ 371 (c)(1),
(2), (4) Date: Jan. 7, 2014

(87) PCT Pub. No.: WO2013/035377
PCT Pub. Date: Mar. 14, 2013

(65) Prior Publication Data
US 2014/0123897 A1   May 8, 2014

(30) Foreign Application Priority Data
Sep. 8, 2011   (JP) .................. 2011-196323

(51) Int. Cl.
*H01J 37/32* (2006.01)
*H05H 1/24* (2006.01)
(Continued)

(52) U.S. Cl.
CPC ...... *H01J 37/32449* (2013.01); *C23C 16/452* (2013.01); *C23C 16/45557* (2013.01);
(Continued)

(58) Field of Classification Search
CPC .......... H01J 37/32348; H01J 37/32449; H05H 1/2406; H05H 2001/2412; C23C 16/452;
(Continued)

(56) References Cited

U.S. PATENT DOCUMENTS 3,637,434 A * 1/1972 Nakanuma .............. C23C 14/34
                                                        117/935
6,189,485 B1   2/2001 Matsuda et al.
(Continued)

FOREIGN PATENT DOCUMENTS

EM    1 475 824 A1      11/2004
JP    05160055 A *       6/1993
(Continued)

OTHER PUBLICATIONS

International Preliminary Report on Patentability and Written Opinion dated Mar. 20, 2014, in PCT/JP2012/060846 with English translation.
(Continued)

*Primary Examiner* — Yuechuan Yu
(74) *Attorney, Agent, or Firm* — Oblon, McClelland, Maier & Neustadt, L.L.P.

(57) ABSTRACT

A plasma generation apparatus according to the present invention includes an electrode cell and a housing that encloses an electrode cell. The electrode cell includes a first electrode, a second electrode facing the first electrode with interposition of a discharge space therebetween, and dielectrics arranged on main surfaces of the electrodes. The plasma generation apparatus further includes a pipe passage configured to directly supply a source gas from the outside of the housing to the discharge space without being connected to a space within the housing where the electrode cell is not arranged.

22 Claims, 13 Drawing Sheets

(51) Int. Cl.
*C23C 16/452* (2006.01)
*C23C 16/455* (2006.01)
*C23C 16/503* (2006.01)

(52) U.S. Cl.
CPC ...... *C23C 16/45565* (2013.01); *C23C 16/503* (2013.01); *H01J 37/32348* (2013.01); *H05H 1/2406* (2013.01); *H05H 2001/2412* (2013.01)

(58) Field of Classification Search
CPC ........ C23C 16/45557; C23C 16/45565; C23C 16/503
See application file for complete search history.

(56) References Cited

U.S. PATENT DOCUMENTS

| | | |
|---|---|---|
| 6,245,396 B1 | 6/2001 | Nogami |
| 6,663,715 B1 | 12/2003 | Yuda et al. |
| 6,779,483 B2 | 8/2004 | Yuda et al. |
| 7,332,039 B2 | 2/2008 | Nogami et al. |
| 7,392,759 B2 | 7/2008 | Yuda et al. |
| 7,771,797 B2 | 8/2010 | Tabata et al. |
| 7,819,081 B2 | 10/2010 | Kawasaki et al. |
| 8,262,846 B2 | 9/2012 | Nogami et al. |
| 8,404,314 B2 | 3/2013 | Kumada et al. |
| 8,883,270 B2 | 11/2014 | Shero et al. |
| 2005/0106094 A1* | 5/2005 | Kondo .................. B82Y 10/00 423/447.1 |
| 2006/0096539 A1 | 5/2006 | Kawasaki et al. |
| 2006/0260748 A1 | 11/2006 | Nogami et al. |
| 2008/0237186 A1 | 10/2008 | Nogami et al. |
| 2008/0295965 A1 | 12/2008 | Nogami et al. |
| 2009/0159432 A1* | 6/2009 | Kawano ............ C23C 16/45563 204/192.15 |
| 2010/0193129 A1 | 8/2010 | Tabata et al. |
| 2011/0070380 A1 | 3/2011 | Shero et al. |
| 2013/0160711 A1 | 6/2013 | Kumada et al. |

FOREIGN PATENT DOCUMENTS

| | | | |
|---|---|---|---|
| JP | 09055372 A | * | 2/1997 |
| JP | 2000 12471 | | 1/2000 |
| JP | 2001 135628 | | 5/2001 |
| JP | 2003 59924 | | 2/2003 |
| JP | 2003051490 A | * | 2/2003 |
| JP | 2004 149857 | | 5/2004 |
| JP | 2004 149919 | | 5/2004 |
| JP | 2004-289166 | | 10/2004 |
| JP | 2004311256 A | * | 11/2004 |
| JP | 2005 144318 | | 6/2005 |
| JP | 2007 266489 | | 10/2007 |
| JP | 2010 47780 | | 3/2010 |
| TW | I260037 | | 8/2006 |
| TW | I344179 B | | 6/2011 |
| TW | 201126009 A1 | | 8/2011 |
| WO | 2007 010594 | | 1/2007 |
| WO | 2009 028084 | | 3/2009 |

OTHER PUBLICATIONS

Supplementary European Search Report dated Mar. 17, 2015 in Patent Application No. EP 12 82 9850.
Search Report dated Mar. 13, 2015 in Taiwanese Patent Application No. 101128730 (with English translation).
U.S. Appl. No. 14/234,560, filed Jan. 23, 2014, Tabata, et al.
International Search Report dated Jul. 24, 2012 in PCT/JP12/060846 Filed Apr. 23, 2012.

* cited by examiner

F I G . 9

| | QUARTZ (SiO$_2$) | ALUMINA (Al$_2$O$_3$) | TiO$_2$ (ANATASE) | TiO$_2$ (RUTILE) | TUNGSTEN OXIDE (WO$_3$) |
|---|---|---|---|---|---|
| ENERGY GAP | 7.8eV | 7.0eV | 3.2eV | 3.0eV | 2.8eV |
| LIGHT WAVELENGTH ABSORBED BY PHOTOCATALYTIC EFFECT | 159nm (VACUUM ULTRAVIOLET) | 177nm (VACUUM ULTRAVIOLET) | 388nm (ULTRAVIOLET) | 413nm (VISIBLE) | 443nm (VISIBLE) |

| | OXIDE FILM (Fe$_2$O$_3$) | CHROMIUM OXIDE (Cr$_2$O$_3$) | Cu$_2$O | In$_2$O$_3$ | Fe$_2$TiO$_3$ |
|---|---|---|---|---|---|
| ENERGY GAP | 2.2eV | 2.07eV | 2.2eV | 2.5eV | <2.8eV |
| LIGHT WAVELENGTH ABSORBED BY PHOTOCATALYTIC EFFECT | 564nm (VISIBLE) | 600nm (VISIBLE) | 564nm (VISIBLE) | 496nm (VISIBLE) | 443nm (VISIBLE) |

| | PbO | V$_2$O$_5$ | FeTiO$_3$ | Bi$_2$O$_3$ | Nb$_2$O$_3$ |
|---|---|---|---|---|---|
| ENERGY GAP | 2.8eV | 2.8eV | 2.8eV | 2.8eV | 3.0eV |
| LIGHT WAVELENGTH ABSORBED BY PHOTOCATALYTIC EFFECT | 443nm (VISIBLE) | 443nm (VISIBLE) | 443nm (VISIBLE) | 443nm (VISIBLE) | 413nm (VISIBLE) |

| | SrTiO$_3$ | ZnO | BaTiO$_3$ | CaTiO$_3$ | SnO$_2$ |
|---|---|---|---|---|---|
| ENERGY GAP | 3.2eV | <3.3eV | 3.3eV | 3.4eV | 3.6eV |
| LIGHT WAVELENGTH ABSORBED BY PHOTOCATALYTIC EFFECT | 388nm (ULTRAVIOLET) | 376nm (ULTRAVIOLET) | 376nm (ULTRAVIOLET) | 365nm (ULTRAVIOLET) | 344nm (ULTRAVIOLET) |

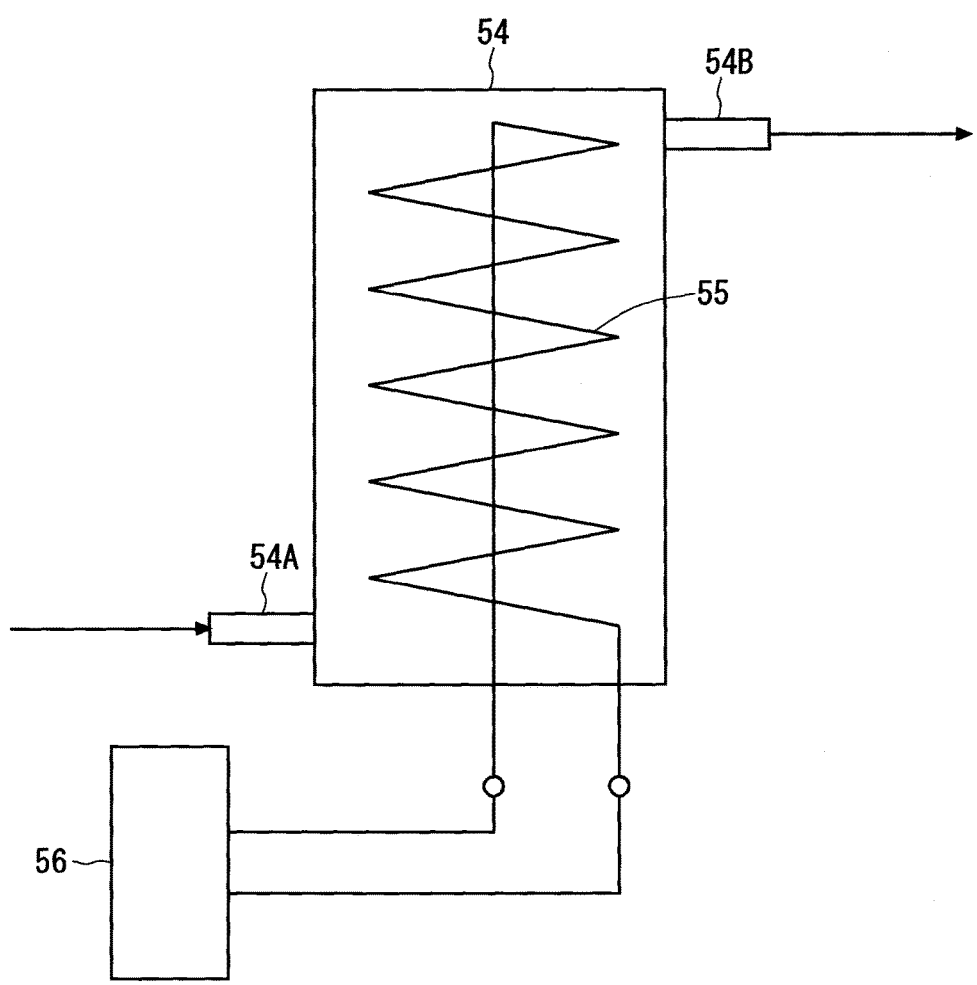
F I G . 1 3

PLASMA GENERATION APPARATUS, CVD APPARATUS, AND PLASMA-TREATED PARTICLE GENERATION APPARATUS

TECHNICAL FIELD

The present invention relates to a plasma generation apparatus configured to generate, from a source gas, a large amount of plasma excitation gas (active gas, radical gas) with a high energy and a high concentration, to a CVD apparatus that includes the plasma generation apparatus and that is configured to suppress the amount of attenuation of the generated plasma excitation gas and effectively supply the generated plasma excitation gas to the CVD apparatus, and to a plasma-treated particle generation apparatus including the plasma generation apparatus.

BACKGROUND ART

In the manufacture of a semiconductor device, a thermal CVD (Chemical Vapor Deposition) apparatus, a photo CVD apparatus, or a plasma CVD apparatus is used in a method for forming a highly functional film (such as a highly conductive film with a low impedance that corresponds to a circuit wiring in a semiconductor chip, a highly magnetic film having a function as a wiring coil of a circuit or a function as a magnet in a semiconductor chip, a highly dielectric film having a function as a capacitor of a circuit in a semiconductor chip, and a highly insulative film formed by oxidation or nitriding and having a highly insulating function that causes a less amount of electrical leakage current in a semiconductor chip). Particularly, the plasma CVD apparatus is often used. For example, as compared with the thermal and photo CVD apparatuses, the plasma CVD apparatus is advantageous in that the temperature of film formation can be lowered, the speed of film formation is higher, and a film formation process can be performed in a short time.

For example, to form a gate insulating film such as a nitride film (for example SiON or HfSiON) or an oxide film ($SiO_2$, $HfO_2$) on a semiconductor substrate, the following technique that uses the plasma CVD apparatus is generally adopted.

Thus, a gas of $NH_3$ (ammonia), $N_2$, $O_2$, $O_3$ (ozone), or the like, and a precursor gas of silicon or a hafnium material are directly supplied to a film formation process chamber of a CVD apparatus, for example. Thereby, a chemical reaction caused by heat, a catalyst, or the like, is promoted, and the precursor gas is dissociated. Metal particles resulting from the dissociated precursor are oxidized or nitrided by the added gas of $NH_3$ (ammonia), $N_2$, $O_2$, $O_3$ (ozone), or the like, and are deposited on a semiconductor wafer that is a processing object. After the deposition, a heat treatment is performed so that a crystal growth occurs. Through the above-described steps, a highly functional film is formed. Accordingly, in the CVD apparatus, high-frequency plasma or microwave plasma is directly generated in the process chamber. Under a state where a wafer substrate is exposed to a radical gas and plasma ions or electrons having a high energy, a highly functional film such as a nitride film or an oxide film is formed on the wafer substrate.

For example, Patent Document 1 may be mentioned as a related art document that discloses a configuration of the plasma CVD apparatus.

In the film formation process within the plasma CVD apparatus, the wafer substrate is directly exposed to plasma, as described above. Therefore, a problem always occurs that the wafer substrate is largely damaged by plasma (ions or electrons) to cause a deterioration in the performance of a semiconductor function.

In contrast, in the film formation process using the thermal and photo CVD apparatuses, the wafer substrate is not damaged by plasma (ions or electrons), so that a highly functional film such as a nitride film or an oxide film is formed with a high quality. However, such a film formation process involves a problem that it is difficult to provide a nitrogen radical gas source or an oxygen radical source with a high concentration and a large amount, and consequently a very long time is required for the film formation.

In the recent thermal and photo CVD apparatuses, a high-concentration $NH_3$ or $O_3$ gas, which is readily dissociated by radiation of heat or light, is used as the source gas, and a thermal catalyst is provided in a CVD chamber. Accordingly, in the thermal and photo CVD apparatuses, a catalytic action promotes dissociation of the gas in the chamber, and a time period for formation of the highly functional film such as a nitride film or an oxide film can be shortened. However, this method faces difficulties in considerably improving the time period for film formation.

Therefore, as an apparatus that can reduce damages to the wafer substrate caused by plasma and that can shorten a time period for the film formation, a film formation processing apparatus of remote plasma type may be mentioned (for example, see Patent Document 2).

In a technique of the Patent Document 2, a plasma generation region and an object processing region are separated from each other by a partition (plasma confinement electrode). More specifically, in the technique according to the Patent Document 2, the plasma confinement electrode is provided between a high-frequency application electrode and a counter electrode on which a wafer substrate is placed, to thereby allow only neutral activated species to be supplied onto the wafer substrate.

Recently, in addition to the application for forming a functional film of a semiconductor, an application using a plasma excitation gas (an active gas, a radical gas) caused by discharge have arisen. One of previous examples thereof is a conventional technique (for example, Patent Document 3) relating to a photocatalyst material generation apparatus using discharge, in which dielectric barrier discharge (silent discharge or creeping discharge) is caused in a discharge gap and fine particles of a metal are put into the dielectric barrier discharge to thereby modify surfaces of the fine particles of the metal into a metal oxide, and a metal oxide material obtained as a result of the surface modification serves as a photocatalyst material.

In the technique according to the Patent Document 3, a high-voltage electrode and a low-voltage electrode are arranged opposed to each other with interposition of a dielectric and a discharge space (such a configuration including a pair of electrodes, a dielectric, and a discharge space will be referred to as an electrode cell).

An AC voltage is applied to the electrode cell, so that dielectric barrier discharge (high-field intermittent discharge plasma) is caused in the discharge space. A source gas containing an oxygen gas and an ozone gas, which is obtained by mixing a powdered metal into oxygen, is supplied to the discharge space where the intermittent discharge plasma is occurring. This generates activated oxygen radical (O atom radical) in the discharge space, and a discharge chemical reaction occurs between the activated oxygen radical (O atom radical) and the powdered metal. The discharge chemical reaction causes the powdered metal to be modified into metal oxide powder. Moreover, due to the discharge chemical reaction in imbalanced discharge plasma generated by the dielectric barrier discharge, fine particles of a photocatalyst material having a good photocatalyst function is generated.

PRIOR-ART DOCUMENTS

Patent Documents

Patent Document 1: Japanese Patent Application Laid-Open No. 2007-266489
Patent Document 2: Japanese Patent Application Laid-Open No. 2001-135628
Patent Document 3: International Publication No. 2007/010594

SUMMARY OF THE INVENTION

Problems to be Solved by the Invention

However, in the technique according to the Patent Document 2 relating to a film formation on a wafer for use in a semiconductor, damages to a processing object material (wafer substrate) caused by plasma is not completely suppressed, and a configuration of the apparatus is complicated.

In a film formation processing apparatus of remote plasma type, in general, a place where plasma is generated is distant from a reaction chamber, and a plasma excitation gas has a short lifetime so that the generated plasma excitation gas returns to the original source gas. Accordingly, in the film formation processing apparatus of remote plasma type, it is difficult to supply a large amount of high-concentration plasma excitation gas to the reaction chamber. In other words, it is difficult to efficiently supply the plasma excitation gas to the reaction chamber.

Therefore, an object of the present invention is to provide a plasma generation apparatus with a simple configuration that achieves an efficient extraction of a generated plasma excitation gas. Particularly, not only a gas that is chemically stabilized in a range of normal temperatures of a nitrogen gas, an oxygen gas, and the like, is used as a source gas supplied to the plasma generation apparatus. A source gas containing, in itself, an active gas such as an ammonia gas and an ozone gas is supplied to the plasma generation apparatus, and a gas containing a precursor gas (precursor gas) of silicon or a hafnium material is supplied. Thus, a first object is to provide a plasma generation apparatus by which: the plasma excitation gas generated in the plasma generation apparatus can be outputted in a larger amount and with a higher concentration; a more special plasma excitation gas can be stably outputted; damages to the processing object material caused by plasma (ions or electrons) during film formation can be completely eliminated; a more highly functional film can be formed; a time period for film formation can be shortened; and a plasma excitation gas having a good performance can be provided to a CVD apparatus.

In addition to the application for forming a functional film of a semiconductor, an application in a technique according to Patent Document 3 may be mentioned, too. In the technique disclosed in the Patent Document 3, a carrier gas containing fine particles of a metal, an active gas containing fine particles of a metal, or a precursor (precursor) gas including atoms of a processing object metal is supplied as a source gas, together with an inert gas, to a housing in which the electrode cell is arranged.

As a result, the source gas permeates not only the discharge space but also the entire inside of the housing in which the electrode cell is arranged. In a case where fine particles of a metal or an active gas is contained in the source gas as described above, a problem arises that the permeation of the source gas through the housing causes corrosion of a power feed part and a surface of an electrode arranged in the housing. Additionally, in a case where a precursor (precursor) gas including atoms of a processing object metal or a gas containing fine particles of a metal is contained in the source gas, a problem arises that the permeation of the source gas through the housing may cause a failure of the apparatus because, for example, the metal is deposited in a region of the inside of the housing other than a discharge part of the electrode cell.

Therefore, a second object of the present invention is to provide a stable plasma generation apparatus by which, even when a source gas that contains fine particles of a metal, an active gas, or a precursor (precursor) gas including atoms of a processing object metal is supplied to a housing in which an electrode cell is arranged, the problems of corrosion of a power feed part and a surface of an electrode arranged within the housing and deposition of the metal within a region of the inside of the housing other than a discharge part of the electrode cell, do not occur.

An additional object of the present invention is to provide a CVD apparatus including the plasma generation apparatus, and a plasma-treated particle generation apparatus including the plasma generation apparatus.

Means for Solving the Problems

To attain the objects, a plasma generation apparatus according to the present invention includes: an electrode cell; a power source part configured to apply an AC voltage to the electrode cell; and a housing that encloses the electrode cell. The electrode cell includes: a first electrode; a second electrode facing the first electrode so as to form a discharge space; a dielectric arranged on at least either one of a main surface of the first electrode facing the discharge space and a main surface of the second electrode facing the discharge space; and a pass-through formed in a central portion of the electrode cell in a plan view, the pass-through penetrating the electrode cell with respect to a facing direction in which the first electrode and the second electrode face each other. The plasma generation apparatus further includes: an insulating tube having a cylindrical shape and arranged in the pass-through, the insulating tube including an ejection hole that is formed in a side surface of the cylindrical shape; and a pipe passage configured to directly supply a source gas from the outside of the housing to the discharge space without being connected to a space within the housing where the electrode cell is not arranged.

A CVD apparatus according to the present invention includes: a plasma generation apparatus; and a CVD chamber connected to the plasma generation apparatus. The plasma generation apparatus includes: an electrode cell; a power source part configured to apply an AC voltage to the electrode cell; and a housing that encloses the electrode cell. The electrode cell includes: a first electrode; a second electrode facing the first electrode so as to form a discharge space; a dielectric arranged on at least either one of a main surface of the first electrode facing the discharge space and a main surface of the second electrode facing the discharge space; and a pass-through formed in a central portion of the electrode cell in a plan view, the pass-through penetrating the electrode cell with respect to a facing direction in which the first electrode and the second electrode face each other. The plasma generation apparatus further includes: an insulating tube having a cylindrical shape and arranged in the pass-through, the insulating tube including an ejection hole that is formed in a side surface of the cylindrical shape; and a pipe passage configured to directly supply a source gas from the outside of the housing to the discharge space without being connected to a space within the housing where the electrode cell is not arranged. The CVD chamber is connected to the pass-through.

A plasma-treated particle generation apparatus according to the present invention includes: a plasma generation apparatus; and a processed material collection flange connected to the plasma generation apparatus. The plasma generation apparatus includes: an electrode cell; a power source part configured to apply an AC voltage to the electrode cell; and a housing that encloses the electrode cell. The electrode cell includes: a first electrode; a second electrode facing the first electrode so as to form a discharge space; a dielectric arranged on at least either one of a main surface of the first electrode facing the discharge space and a main surface of the second electrode facing the discharge space; and a pass-through formed in a central portion of the electrode cell in a plan view, the pass-through penetrating the electrode cell with respect to a facing direction in which the first electrode and the second electrode face each other. The plasma generation apparatus further includes: an insulating tube having a cylindrical shape and arranged in the pass-through, the insulating tube including an ejection hole that is formed in a side surface of the cylindrical shape; and a pipe passage configured to directly supply a source gas from the outside of the housing to the discharge space without being connected to a space within the housing where the electrode cell is not arranged. The processed material collection flange is connected to the pass-through.

Effects of the Invention

The plasma generation apparatus according to the present invention includes: an electrode cell; a power source part configured to apply an AC voltage to the electrode cell; and a housing that encloses the electrode cell. The electrode cell includes: a first electrode; a second electrode facing the first electrode so as to form a discharge space; a dielectric arranged on at least either one of a main surface of the first electrode facing the discharge space and a main surface of the second electrode facing the discharge space; and a pass-through formed in a central portion of the electrode cell in a plan view, the pass-through penetrating the electrode cell with respect to a facing direction in which the first electrode and the second electrode face each other. The plasma generation apparatus further includes: an insulating tube having a cylindrical shape and arranged in the pass-through, the insulating tube including an ejection hole that is formed in a side surface of the cylindrical shape; and a pipe passage configured to directly supply a source gas from the outside of the housing to the discharge space without being connected to a space within the housing where the electrode cell is not arranged.

Accordingly, for example, a gas containing an active gas, a metal precursor gas, and fine metal particles can be supplied into each discharge space via the pipe passage without contacting a space within the housing other than the discharge space. This can prevent occurrence of a contact of the active gas with an electrode portion of the electrode cell. Therefore, occurrence of corrosion of the electrode portion, which may be caused by the active gas, is prevented. Since the gas containing the metal precursor gas or the fine metal particles is directly supplied to the discharge space, occurrence of deposition of a metal in a space within the housing other than the discharge space is also prevented.

The pipe passage is provided that is configured to directly supply the source gas from the outside of the housing to the discharge space without being connected to a space within the housing where the electrode cell is not arranged. A passive film that does not cause corrosion and the like due to a chemical reaction of the active gas, or a platinum film or a gold film that have a high resistance to chemical reaction, is performed on the inner surface of the pipe passage. This can prevent occurrence of corrosion of the inner surface of the pipe passage.

The source gas containing the active gas, the precursor gas, and the fine metal particles is supplied to generate a plasma excitation gas. Accordingly, in the present invention, a larger amount of plasma excitation gas with a higher concentration can be outputted. The precursor gas is dissociated into metal atoms by means of discharge, and due to an imbalanced discharge chemical reaction of dielectric barrier discharge, the metal atoms obtained as a result of the dissociation and the fine metal particles themselves can be modified into a nitrided material or an oxidized material having a higher function, and outputted.

In the present invention, the distance for supply from the discharge space where the plasma excitation gas is generated to the hollow portion that outputs the excitation gas is shortest. Additionally, in the present invention, a pressure difference can be caused between the discharge space and the hollow portion of the insulating tube by using a pressure reducer. Accordingly, in the present invention, by using the pressure difference, the plasma excitation gas can be ejected through the ejection hole of the insulating tube by adiabatic expansion, and efficiently led from the discharge space to the hollow portion in which the pressure is reduced. Thus, the present invention is able to suppress occurrence of collision among the plasma excitation gases in a region from the discharge space to the hollow portion, and also can suppress occurrence of collision of the plasma excitation gas with a wall and the like. Therefore, the amount of attenuation caused by collisions of the plasma excitation gas can be suppressed. This enables the plasma excitation gas to be more efficiently guided into the hollow portion.

In the present invention, the plasma excitation gas is generated by using dielectric barrier discharge that enables injection of discharge energy having a high energy density. It has been revealed that, when dielectric barrier discharge occurs under a state where the discharge space is in a vacuum state in which the pressure is equal to or lower than an absolute pressure 30 kPa, it is difficult to stably obtain discharge plasma having a high energy density, because the gas density is low. In this respect, the present invention adopts a structure in which the pressure difference is generated at the ejection hole of the insulating tube which is located between the discharge space and the hollow portion in a vacuum state in which the pressure is equal to or lower than the absolute pressure 30 kPa. Accordingly, dielectric barrier discharge with a pressure equal to or higher than the absolute pressure 30 kPa, which enables injection of discharge energy having a high energy density, can be performed. Therefore, even when the plasma generation apparatus is made compact, a large amount of plasma excitation gas with a high concentration can be generated.

Moreover, in the present invention, the electrode cells for generating the dielectric barrier discharge are stacked in multiple stages. The plasma excitation gas generated in the discharge space of each electrode cell is ejected through the ejection hole of the insulating tube to the hollow portion having a vacuum state. Then, the ejected plasma excitation gases join together in the hollow portion having the vacuum state. The plasma excitation gases having joined together is led to the CVD chamber. Since the plasma excitation gases join together in the hollow portion having the vacuum state, the amount of plasma excitation gas can be increased. Thus, the amount of attenuation caused by collisions of the plasma excitation gas is suppressed, and a large amount of plasma excitation gas with a higher concentration can be led to the CVD chamber.

In the CVD apparatus according to the present invention, the plasma generation apparatus that generates the plasma excitation gas from the source gas and the CVD chamber that performs a film formation process on a processing object material by using the generated plasma excitation gas are separate and different apparatuses.

Since a plasma generation source and a processing region are completely separated, occurrence of collision of ions generated by dissociation in the plasma source with the processing object material arranged in the processing region can be prevented. This can completely eliminate damages to the processing object material caused by plasma. Additionally, in the CVD chamber, a plasma CVD process is performed with use of a large amount of plasma excitation gas with a higher concentration. This can shorten a time period for formation of a film on the processing object material.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 A diagram for explaining the operation of the plasma generation apparatus 100 according to the embodiment 2.

FIG. 13 A cross-sectional view showing, on an enlarged scale, a configuration of a plasma generation apparatus according to an embodiment 6.

EMBODIMENT FOR CARRYING OUT THE INVENTION

In the following, a specific description will be given to the present invention with reference to the drawings that illustrate embodiments of the present invention.

<Embodiment 1>

In this embodiment, application of a plasma apparatus according to the present invention to CVD (Chemical Vapor Deposition) will be described.

Figure 1:
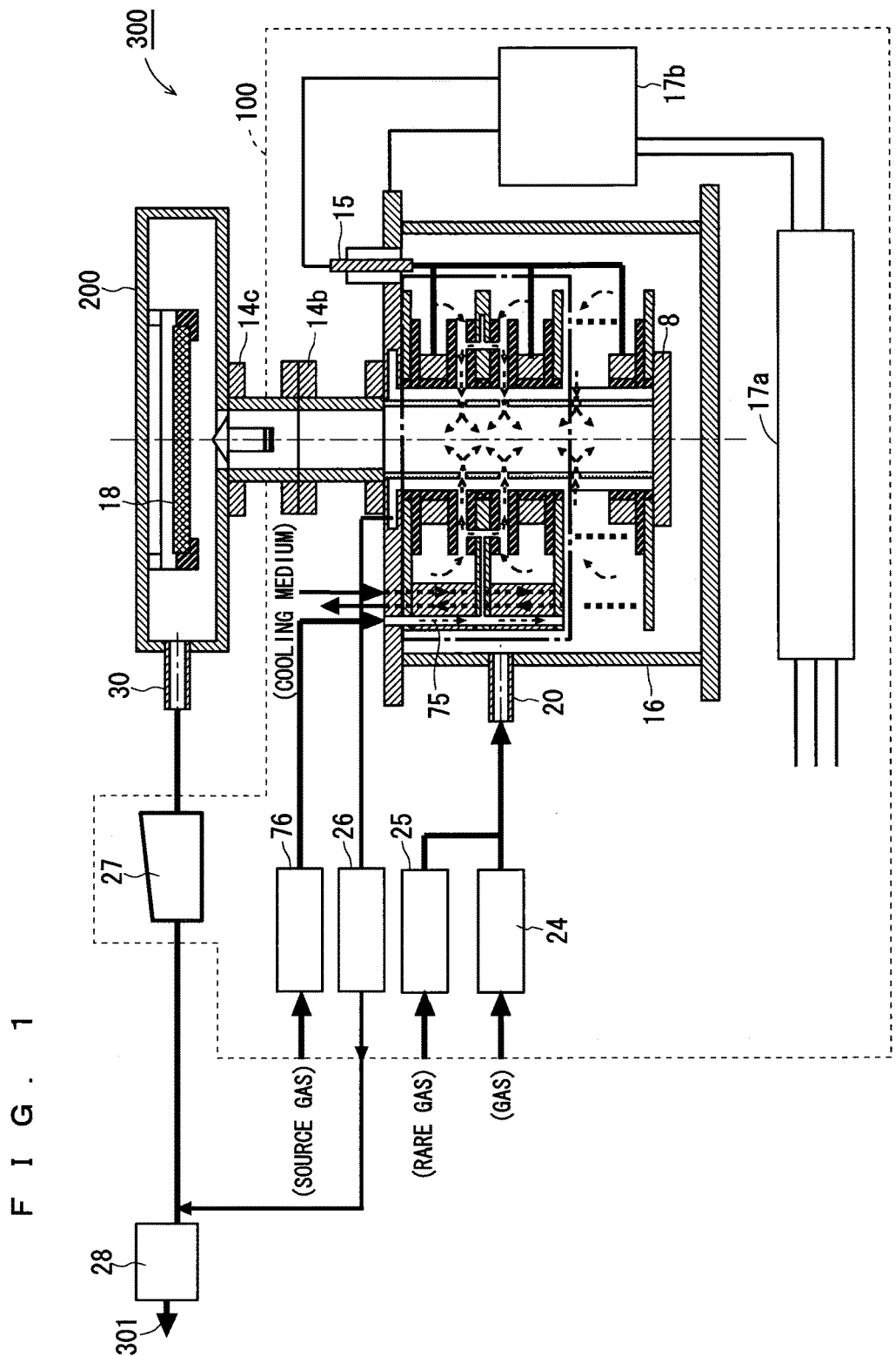
FIG. 1 A cross-sectional view showing an overall configuration of a CVD apparatus 300 according to an embodiment 1.
Figure 2:
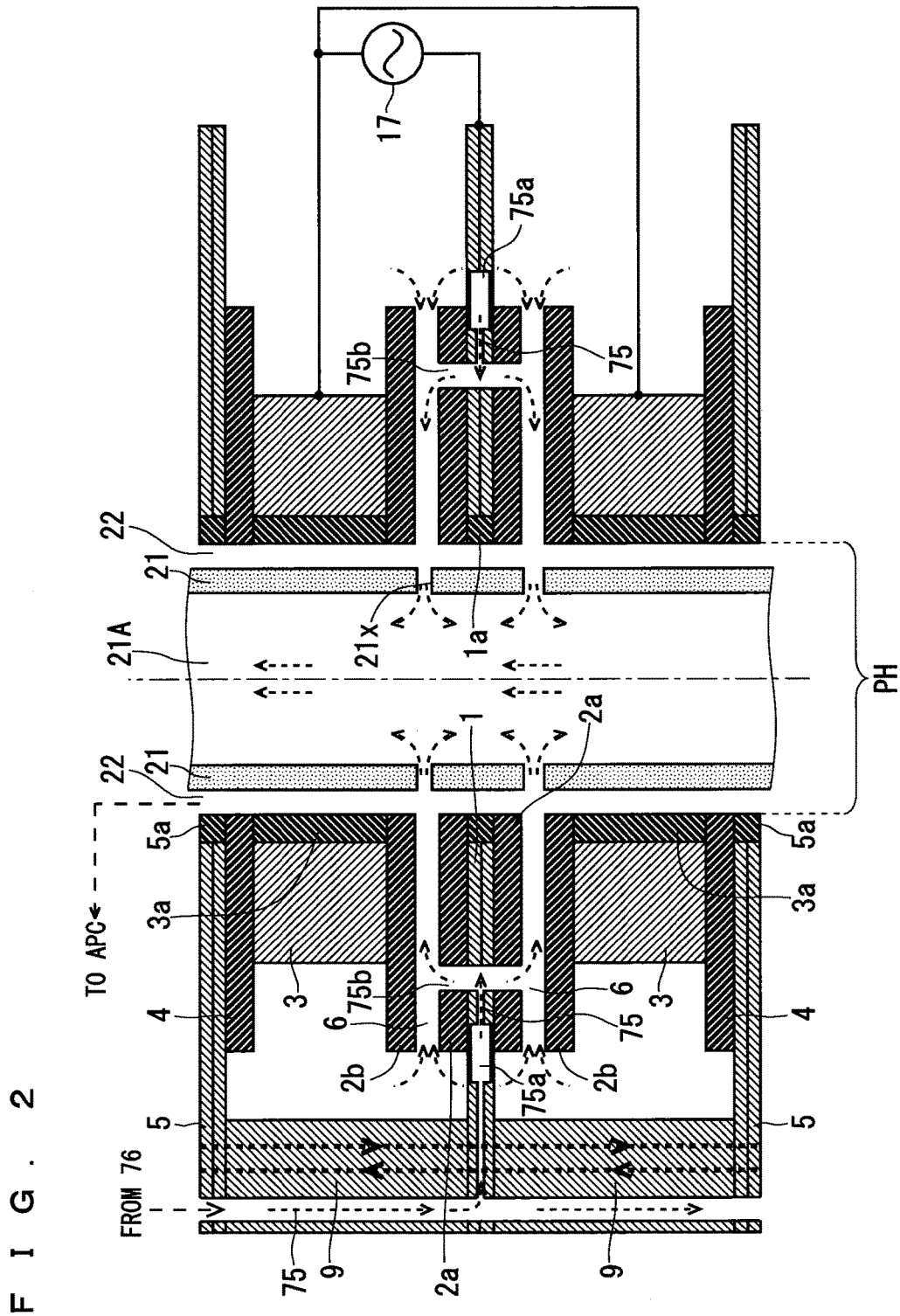
FIG. 2 A cross-sectional view showing, on an enlarged scale, a configuration of an electrode cell.

FIG. 1 is a cross-sectional view showing a configuration of a CVD apparatus 300 according to this embodiment. FIG. 2 is a cross-sectional view showing, on an enlarged scale, a region enclosed by the broken line in FIG. 1 (FIG. 2 discloses a detailed configuration of a cross-section of an electrode cell).

As shown in FIG. 1, the CVD apparatus 300 includes a plasma generation apparatus 100, a CVD chamber 200, and an exhaust gas decomposition processor 28.

Firstly, a configuration of the plasma generation apparatus 100 according to the present invention will be described.

As shown in FIG. 1, in the plasma generation apparatus 100, a plurality of electrode cells are stacked in the vertical direction of FIG. 1. In the cross-sectional view on an enlarged scale shown in FIG. 2, two electrode cells are illustrated. A configuration of the electrode cells having a stacked structure will be described with reference to FIG. 2.

Each electrode cell has a doughnut shape in a plan view, that is, when seen along the vertical direction of FIGS. 1 and 2. In other words, the electrode cell has a substantially disk-like outer shape, and a pass-through PH is formed in a central portion of the electrode cell. The pass-through PH penetrates the electrode cell in the vertical direction (the direction in which the electrode cells are stacked).

Each electrode cell includes a low-voltage electrode 1, dielectrics 2a, 2b, a high-voltage electrode 3, an insulating plate 4, and a high-pressure cooling plate 5. The plurality of electrode cells are stacked in the vertical direction of FIGS. 1 and 2 (the direction in which the high-voltage electrode 3 and the low-voltage electrode 1 are opposed to each other).

In a plan view, each electrode cell has a circular shape with the pass-through PH, as described above. Therefore, each of the members 1, 2a, 2b, 3, 4, and 5 is formed as a plate whose other shape is a circular shape in a plan view. The above-mentioned pass-through PH is provided in a central portion of each of the members 1, 2a, 2b, 3, 4, and 5.

As shown in FIG. 2, an AC voltage from an AC power source 17 is applied to the low-voltage electrode 1 and the high-voltage electrode 3. The low-voltage electrode 1, as well as a connection block 9, the high-pressure cooling plate 5, and the housing 16 which will be described later, is set to a fixed potential (ground potential).

The dielectric 2a is arranged on a main surface of the low-voltage electrode 1. To be more specific, one main surface of the dielectric 2a is in contact with the main surface of the low-voltage electrode 1. A conductive material is, for example, applied, printed, or vapor-deposited on the one main surface of the dielectric 2a. The dielectric 2b is arranged so as to face the dielectric 2a with the discharge space 6 being interposed between the dielectric 2b and the dielectric 2a. To be more specific, the other main surface of the dielectric 2a faces one main surface of the dielectric 2b with interposition of the discharge space 6 therebetween. A plurality of spacers (not shown) are interposed between the dielectric 2a and the dielectric 2b. The spacers hold and fix a gap of the discharge space 6. The dimension of the discharge space 6 with respect to the vertical direction of FIG. 2 is, for example, about 0.05 mm to several mm.

The high-voltage electrode 3 is arranged on the other main surface of the dielectric 2b. To be more specific, one main surface of the high-voltage electrode 3 is in contact with the other main surface of the dielectric 2b. A conductive material is, for example, applied, printed, or vapor-deposited on the other main surface of the dielectric 2b. One main surface of the insulating plate 4 is in contact with the other main surface of the high-voltage electrode 3. The high-pressure cooling plate 5 is in contact with the other main surface of the insulating plate 4 (although one example that adopts a stack configuration including the insulating plate 4 and the high-pressure cooling plate 5 is illustrated herein, a stack configuration not including the insulating plate 4 and the high-pressure cooling plate 5 is also adoptable).

The dielectric 2a on which the conductive material is applied or the like, the spacers (not shown), and the dielectric 2b on which the conductive material is applied or the like, may be configured as an integrated body.

As shown in FIG. 2, in each electrode cell, the low-voltage electrode 1 and the high-voltage electrode 3 face each other with interposition of the dielectrics 2a, 2b and the discharge space 6 therebetween. That is, the dielectrics 2a, 2b are arranged on the main surface of the low-voltage electrode 1 facing the discharge space 6 and the main surface of the high-voltage electrode 3 facing the discharge space 6, respectively. This embodiment adopts such a structure because a dielectric material having a high resistance to sputtering and high non-conductive properties is an effective material for both surfaces of the discharge space 6 where a discharge occurs.

Instead of the configuration shown in FIG. 2, only either one of the dielectric 2a and the dielectric 2b can be omitted.

The electrode cell having the configurations 1, 2a, 2b, 3, 4, and 5 has the pass-through PH penetrating therethrough in the direction in which these configurations are stacked, as described above. The pass-throughs PH formed in the electrode cells are connected in the direction in which the electrode cells are stacked, to form a single through hole. In this specification, the single through hole will be referred to as a "continuous through hole". As seen from the description given above, the continuous through hole extends in the stacking direction.

In this embodiment, as shown in FIG. 2, the electrode cells that neighbor each other with respect to the vertical direction share one low-voltage electrode 1 as a common component part (the two electrode cells that share the one low-voltage electrode 1 as a common component part will be referred to as a electrode cell pair). This is only for reducing the number of parts by adopting a common configuration. Such a common configuration may not be adopted.

In the configuration shown in FIG. 2, a structure of one electrode cell pair is shown, and a plurality of the electrode cell pairs are stacked in the vertical direction of FIG. 2. A connection block 9 is interposed between each of the low-voltage electrodes 1 and each of the high-pressure cooling plates 5. That is, the connection block 9 is placed at the lateral side of each electrode cell. The presence of the connection block 9 enables the dimension of a portion of each electrode cell between the low-voltage electrode 1 and the high-pressure cooling plate 5 to be kept at a constant value. The connection block 9 is not placed over the entire lateral side of the electrode cell, but placed only at a part of the lateral side (at the left side of the cross-sectional view shown in FIG. 2) of the electrode cell, as shown in FIG. 2.

In the plasma generation apparatus 100, as shown in FIG. 2, an insulating tube 21 is placed within the above-mentioned continuous through hole. The insulating tube 21 has a cylindrical shape with a hollow portion 21A penetrating therethrough in the vertical direction of FIG. 2. The insulating tube 21 is arranged in the continuous through hole such that the cylindrical axis direction of the insulating tube 21 is in parallel with the direction in which the electrode cells are stacked (more specifically, the axial direction of the continuous through hole is coincident with the cylindrical axis direction of the insulating tube 21).

A plurality of fine ejection holes (nozzle holes) 21x are provided in a side surface of the insulating tube 21. In the exemplary configuration shown in FIG. 2, the ejection holes 21x are provided in the insulating tube 21 such that each of them faces the discharge space 6. The diameter of an opening of each ejection hole 21x is smaller than the diameter of the discharge space 6 with respect to the stacking direction. The insulating tube 21 is made of quartz, alumina, or the like. This embodiment adopts, as the insulating tube 21, a single insulating tube in which a plurality of fine ejection holes 21x are provided. Instead, however, the insulating tube 21 may be configured such that rings-shaped insulating tubes each having a plurality of fine ejection holes 21x formed therein are stacked in the pass-throughs PH.

As shown in FIG. 2, a circumferential surface facing the inside the continuous through hole and an outer circumferential surface of the insulating tube 21 are spaced apart from each other at a predetermined interval. In other words, a pipe passage 22 is provided between the side surface of the electrode cell facing the pass-throughs PH (or the continuous through hole) and the side surface of the insulating tube 21, as shown in FIG. 2. The pipe passage 22 has an annular shape when seen along the vertical direction of FIG. 2. Thus, the side surface of the electrode cell facing the pass-throughs PH (or the continuous through hole) in a plan view serves as an outer circumference while the side surface of the insulating tube 21 in a plan view serves as an inner circumference, and a space between the outer circumference and the inner circumference serves the pipe passage 22 having the annular shape in a plan view.

The pipe passage 22 is connected to the discharge space 6 at the outer circumference side. An end portion of the pipe passage 22 extends through an upper surface of the housing 16, to be connected to an auto pressure controller (APC) 26 provided outside the housing 16 as will be described later (see FIG. 1).

The high-pressure cooling plate 5, the high-voltage electrode 3, and the low-voltage electrode 1 are made of a conductive material. An insulator 5a is provided in a portion of the high-pressure cooling plate 5 facing the insulating tube 21. An insulator 3a is provided in a portion of the high-voltage electrode 3 facing the insulating tube 21. An insulator 1a is provided in a portion of the low-voltage electrode 1 facing the insulating tube 21.

Thus, in each electrode cell, a portion facing the insulating tube 21, including the members 4, 2a, and 2b, is entirely made of an insulating material. Therefore, the whole of an inner surface of the pipe passage 22 formed in the continuous through hole of each electrode cell has insulating properties. This can prevent occurrence of discharge (abnormal discharge) at a place within the pipe passage 22 other than the discharge space.

A passage (not shown) through which a cooling medium passes is formed in each of the connection blocks 9 stacked in the vertical direction of FIGS. 1 and 2. A passage (not shown) is also formed within the high-pressure cooling plate 5 and within the low-voltage electrode 1. The cooling medium, which is supplied from the outside, flows through the passage formed within the connection block 9, circulates through the passage formed within each high-pressure cooling plate 5 and the passage formed within each low-voltage electrode 1, and is outputted to the outside through another passage formed within the connection block 9.

The cooling medium whose temperature has been adjusted to a constant temperature is caused to flow through the passage formed within the high-pressure cooling plate 5, and thereby the high-voltage electrode 3 is cooled to the constant temperature via the insulating plate 4. The cooling medium whose temperature has been adjusted to a constant temperature is caused to flow through the passage formed within the low-voltage electrode 1, and thereby the low-voltage electrode 1 itself is cooled to and kept at the constant temperature, so that the temperature of a gas within the discharge space 6 can be indirectly kept at the constant temperature, too. The temperature of the cooling medium is adjusted to the constant temperature within a range of, for example, several ° C. to 25° C.

In a case where a metal precursor gas is supplied as the source gas to the discharge space 6; depending on the type of the metal precursor gas, it may be sometimes preferable that a liquid having a relatively high temperature, instead of the cooling medium, is caused to flow through the passage formed within the low-voltage electrode 1, and the like, as will be described below. This is for the prevention of dew condensation of metal particles within the discharge space 6.

The liquid having a relatively high temperature is a liquid whose temperature has been adjusted to a constant temperature within a range of about 100° C. to 200° C. The liquid, which is supplied from the outside, flows through the passage formed within the connection block 9, circulates through the passage formed within each high-pressure cooling plate 5 and the passage formed within each low-voltage electrode 1, and is outputted to the outside through another passage formed within the connection block 9.

The liquid whose temperature has been adjusted to a constant temperature is caused to flow through the passages formed within the connection block 9, the low-voltage electrode 1, and the like, and thereby the connection block 9, the low-voltage electrode 1, and the like, are kept at the constant temperature. Furthermore, the temperature of a gas within the discharge space 6 is indirectly kept at the constant temperature, too, via the low-voltage electrode 1.

In a case where the metal precursor gas is adopted as the source gas, a cooling medium or a liquid having a relatively high temperature is caused to flow through the passages formed within the low-voltage electrode 1, and the like, in accordance with the type of the metal precursor gas.

In the plasma generation apparatus 100 according to the present invention, a pipe passage 75 for supplying the source gas to the discharge space 6 is placed. The pipe passage 75 is not connected to a space within the housing 16 where the electrode cell is not arranged, and directly connects the outside of the housing 16 to the discharge space 6. That is, the source gas flowing through the pipe passage 75 is not supplied to an outer circumferential region of the electrode cell within the housing 16, but directly supplied to each discharge space 6 of each electrode cell.

As shown in FIGS. 1 and 2, the pipe passage 75 extends from an upper portion of the housing 16 to the inside of each connection block 9. The pipe passage 75 branches each low-voltage electrode 1, so that the pipe passage 75 is arranged within each low-voltage electrode 1.

The pipe passage 75 includes a buffer 75a. The buffer 75a is arranged so as to revolve in the low-voltage electrode 1. The dimension of the buffer 75a with respect to the stacking direction is larger than the dimension of another portion of the pipe passage 75 arranged within the low-voltage electrode 1 with respect to the stacking direction.

The pipe passage 75 includes an ejection port 75b. The ejection port 75b penetrates the low-voltage electrode 1 and the dielectric 2a that is in contact with the low-voltage electrode 1. The ejection port 75b is connected to the discharge space 6 of the electrode cell. As shown in FIG. 2, the buffer 75a and the ejection port 75b are connected to each other by the pipe passage 75.

Each of the low-voltage electrode 1 and the dielectric 2a has a circular shape in a plan view. In each low-voltage electrode 1 and each dielectric 2a, a plurality of the ejection ports 75b are arranged along the circumferential direction of the circular shape. It is desirable that the interval of the ejection ports 75b arranged long the circumferential direction is constant. The ejection port 75b faces the discharge space 6, and it is desirable that the ejection port 75b is arranged as close to the outside of the discharge space 6 as possible (in other words, close to the outer circumference side of the electrode cell where the insulating tube 21 is not provided). This enables the active gas, the metal precursor gas, and the like, to be uniformly ejected from the ejection port 75b into each discharge space 6. The ejected gas propagates radially inward from the outer circumference to the inner side (to the insulating tube 21 side) of a discharge surface.

Needless to say, the ejection ports 75b arranged along the circumferential direction are connected to one another via the pipe passages 75 and the buffers 75a formed so as to revolve in the low-voltage electrode 1.

The pipe passage 75 having the above-described configuration is connected to a source gas MFC (Mass Flow Controller) 76 arranged in the outside of the housing 16.

As seen from the above-described configuration of the pipe passage 75, the source gas outputted from the source gas MFC 76 enters the inside of the housing 16 from the upper portion thereof, propagates within each connection block 9, branches at each low-voltage electrode 1, and propagates through each low-voltage electrode 1. Then, the source gas permeates the buffer 75a, and then is supplied from the ejection port 75b into the discharge space 6 without contacting the outer circumferential region of the electrode cell within the housing 16.

The passage through which the described above cooling medium (the liquid whose temperature has been adjusted) passes and the pipe passage 76 are separate and different paths.

Each of the parts 75, 75a, and 75b that serve as a pipe passage for directly supplying the source gas from the outside of the housing into the discharge space without contacting a space within the housing where the electrode cell is not arranged has, on its inner surface (wall surface), a passive film causing no corrosion by a chemical reaction of the active gas or a platinum film or a gold film having a high resistance to a chemical reaction.

To ensure the airtightness of each passage and the pipe passage 75, precision members such as O-rings are arranged in a connection portion connecting the connection block 9 to the high-pressure cooling plate 5 and in a connection portion connecting the connection block 9 to the low-voltage electrode 1.

As shown in FIG. 1, the plasma generation apparatus 100 includes the housing 16. The housing 16 is made of, for example, aluminum or SUS. The plurality of electrode cells are arranged in a stacked manner within the housing 16 in which the airtightness is ensured. Thus, a stack of the electrode cells is covered with an upper surface, a lower surface, and a side surface of the housing 16. A space is present between the side surface of the housing 16 and the side surface of each electrode cell. A space is also present between a bottom surface of the housing 16 and a lowermost portion of each electrode cell. As shown in FIG. 1, the stack of electrode cells is firmly fixed to the upper surface of the housing 16 by a fastening member 8.

The plasma generation apparatus 100 includes the AC power source 17 shown in FIG. 2. As shown in FIG. 1, the AC power source 17 includes an inverter 17a and a high-voltage transformer 17b.

The inverter 17a performs a frequency conversion process on an AC voltage of 60 Hz inputted thereto, and as a result outputs an AC voltage of 15 kHz to the high-voltage transformer 17b. The high-voltage transformer 17b performs a voltage step-up process on an AC voltage of 200 to 300V inputted thereto, and as a result outputs an AC voltage of several kV to several tens of kV.

One end of the high-voltage transformer 17b is connected to each high-voltage electrode 3 via an electricity supply terminal 15. The other end of the high-voltage transformer 17b is connected to the housing 16. The housing 16, the high-pressure cooling plate 5, the connection block 9, and the low-voltage electrode 1 are electrically connected, and set to a fixed potential (ground potential). As seen from the configuration shown in FIG. 2, the high-pressure cooling plate 5 and the high-voltage electrode 3 are electrically insulated from each other by the insulating plate 4.

As shown in FIG. 1, the plasma generation apparatus 100 includes a gas supply part 20, a gas MFC 24, and a sub gas MFC 25. The plasma generation apparatus 100 further includes the source gas MFC 76, as described above.

In this embodiment, the source gas MFC 76 outputs an active gas as the source gas. In accordance with a material of a film to be formed on a processing object material 18 placed in the CVD chamber 200, an active gas such as an ozone gas, an ammonia gas, or a nitrogen oxide gas is supplied from the source gas MFC 76 to the pipe passage 75. The active gas may be supplied together with an inert gas.

In this embodiment, a metal precursor (precursor) gas for obtaining functional material particles that are nitrided, oxidized, or the like, is supplied as the source gas from the source gas MFC 76. In accordance with a material of a film to be formed on the processing object material 18 placed in the CVD chamber 200, a metal precursor gas obtained by vaporization of a metal such as hafnium is outputted from the source gas MFC 76 to the pipe passage 75. The metal precursor gas may be supplied together with an inert gas.

The gas supply part 20 is provided in the side surface of the housing 16. The gas supply part 20 supplies a predetermined gas from the outside of the housing 16 into the housing 16. More specifically, the predetermined gas passes through the gas supply part 20, and is supplied to an outer circumferential portion of the electrode cell (that is, a region within the housing 16 in which the stack of electrode cells is not arranged).

An inert gas such as a nitrogen gas and an oxygen gas is supplied from the gas MFC 24. A rare gas (such as a helium gas and an argon gas) is supplied from the sub gas MFC 25. As shown in FIG. 1, in a pipe passage provided halfway, the inert gas and the rare gas are mixed. Then, the inert gas and the rare gas are supplied to the gas supply part 20.

It may be acceptable that the gas MFC 24 supplies a predetermined gas into the housing 16 for a reaction in the discharge space 6, or that the gas MFC 24 supplies the predetermined gas as a carrier gas into the housing 16.

Although the gas supply part 20 supplies the predetermined gas together with the rare gas into the housing 16 in this embodiment, it may be also possible that only the predetermined gas is supplied to the housing 16.

As shown in FIG. 1, the plasma generation apparatus 100 includes the auto pressure controller 26. As described above, the auto pressure controller 26 is connected to the pipe passage 22 shown in FIG. 2. Moreover, as described above, the annular pipe passage 22 is, at the outer circumference side thereof, connected to the discharge space 6. This configuration enables each discharge space 6 to be kept at a constant pressure by the auto pressure controller 26 via the pipe passage 22. For example, the auto pressure controller 26 keeps each discharge space 6 at a constant pressure within a pressure range of 0.03 MPa (mega Pascal) to 0.3 MPa.

In this embodiment, the plasma generation apparatus 100 includes a pressure reducer 27. In the configuration shown in FIG. 1, the pressure reducer 27 is connected to the hollow portion 21A of the insulating tube 21 via the CVD chamber 200. For example, a vacuum pump is adoptable as the pressure reducer 27. This configuration enables the pressure reducer 27 to reduce the pressure in the hollow portion 21A of the insulating tube 21 to a pressure lower than the atmospheric pressure (for example, 1 to 5000 Pa (Pascal)). In the exemplary configuration shown in FIG. 1, as described above, the pressure reducer 27 is connected to the CVD chamber 200, too. Therefore, the pressure in the CVD chamber 200 is also reduced to, for example, about 1 to 5000 Pa by the pressure reducer 27.

In the plasma generation apparatus 100 having the above-described configuration, an end portion of the insulating tube 21 is connected to an upper surface of the CVD chamber 200 (a surface thereof facing a processing surface of the processing object material 18) via two gas output flanges 14b, 14c (see FIG. 1). Thus, the gas output flanges 14b, 14c serve as joints between the hollow portion 21A of the insulating tube 21 and the CVD chamber 200. As seen from the above-described configuration, a gas and the like existing in the hollow portion 21A of the insulating tube 21 can be supplied into the CVD chamber 200 via the gas output flanges 14b, 14c (a stream of the gas can be generated by a suction force of the pressure reducer 27).

The processing object material 18 such as a semiconductor wafer is placed in a reaction chamber within the CVD chamber 200. In the CVD chamber 200, the processing object material 18 is exposed to a gas propagated from the hollow portion 21A of the insulating tube 21. Thereby, particles obtained as a result of chemical bonding between a plasma process gas and a process gas supplied to the CVD chamber 200 to be deposited with a uniform thickness on a surface of the processing object material 18. Due to this deposition, a film is formed on the surface of the processing object material 18. Performing a heat treatment or the like on the formed film can cause a growth of the film itself. Through the above-described process, modification into a desired highly functional film is enabled.

An exhaust gas output port 30 is provided in a side surface of the CVD chamber 200. The exhaust gas output port 30 is connected to the pressure reducer 27. The pressure reducer 27 reduces the pressure within the hollow portion 21A of the insulating tube 21 and the pressure within the CVD chamber 200. This pressure reduction operation can generate a stream of a gas, particles, and the like, flowing from the hollow portion 21A of the insulating tube 21→the gas output flanges 14b, 14c→the inside of the CVD chamber 200→the exhaust gas output port 30→the pressure reducer 27.

As shown in FIG. 1, the pressure reducer 27 and the auto pressure controller 26 are connected to the exhaust gas decomposition processor 28. Therefore, a gas and the like outputted from the pressure reducer 27 and the auto pressure controller 26 are subjected to a decomposition process by the exhaust gas decomposition processor 28. The gas on which the decomposition process has been performed is, as a process gas 301, exhausted from the exhaust gas decomposition processor 28.

Next, an operation of the CVD apparatus 300 according to this embodiment, including an operation of the plasma generation apparatus 100, will be described.

Referring to FIG. 1, a source gas such as an active gas and a metal precursor gas is supplied from the source gas MFC 76 into the housing 16. The supplied source gas is inputted to the pipe passage 75, passes through the pipe passage 75, and directly supplied to each discharge space 6 (that is, the source gas is supplied to the discharge space 6 without contacting a space within the housing 16 other than the discharge space 6).

The gas MFC 24 supplies a predetermined gas, such as a gas that contributes to a reaction caused in the discharge space 6 or a gas functioning a carrier gas. The sub gas MFC 25 supplies a rare gas. The supplied predetermined gas and rare gas join and mix together before they are inputted to the gas supply part 20. The mixed predetermined gas and rare gas are supplied from the gas supply part 20 into the housing 16 of the plasma generation apparatus 100.

The supplied predetermined gas and rare gas permeate the inside of the housing 16. The predetermined gas and the like having permeated the inside of the housing 16 enter the discharge space 6 formed in each electrode cell from the outer circumferential side of the electrode cell whose outer shape is circular in a plan view.

As shown in FIG. 2, in each electrode cell, the AC power source 17 applies a high-frequency AC voltage between the high-voltage electrode 3 and the low-voltage electrode 1. Application of the AC voltage to the electrodes 1, 3 causes dielectric barrier discharge (silent discharge) with high-frequency plasma to uniformly occur in the discharge space 6 of each electrode cell.

In the discharge space 6 where the dielectric barrier discharge is occurring, the source gas and the like are supplied as described above. As a result, due to the dielectric barrier discharge, a discharge dissociation reaction of the supplied gas is caused in the discharge space 6.

For example, a case is assumed in which a metal precursor gas is supplied as the source gas through the pipe passage 75 while an inert gas of oxygen, nitrogen, or the like, is supplied as the predetermined gas through the gas supply part 20. In such a case, the metal precursor gas is decomposed into a metal gas and another gas due to the dielectric barrier discharge occurring in the discharge space 6. Due to the dielectric barrier discharge occurring in the discharge space 6, a plasma excitation gas is generated in a large amount and with a high concentration. As a result of dissociation caused by the discharge, the plasma excitation gas is generated from the supplied inert gas of oxygen, nitrogen, or the like, and the active gas such as ozone or an ammonia gas. In the discharge space 6 and the like, the plasma excitation gas reacts with the metal gas obtained as a result of the decomposition, to generate a functional material gas (such as an oxidized material particle gas or a nitrided material particle gas).

In a case where an inert gas of oxygen, nitrogen, or the like, is supplied as the predetermined gas from the gas supply part 20, as described above, a plasma excitation gas is generated from the supplied inert gas due to the dielectric barrier discharge occurring in the discharge space 6. In order to increase the concentration and the amount (the flow rate) of the plasma excitation gas to which the processing object material 18 will be exposed and in order to generate a highly functional particle gas, an active gas is supplied as the source gas through the pipe passage 75.

The auto pressure controller 26 keeps each discharge space 6 to a constant pressure Pa, and the pressure reducer 27 such as a vacuum pump sets a pressure Pb in the hollow portion 21A of the insulating tube 21 to be lower than the pressure Pa in the discharge space 6 (Pa>Pb).

Since the pressure reducer 27 reduces the pressure Pb in the hollow portion 21A, a pressure difference $\Delta P$ (=Pa−Pb) occurs between the discharge space 6 and the hollow portion 21A with interposition of the fine ejection holes 21x of the insulating tube 21. This pressure difference $\Delta P$ can generate a stream of the gas ejected from the discharge space 6 to the hollow portion 21A to occur at the ejection holes 21x. In a case where the pressure difference $\Delta P$ is caused under a state where the fine ejection holes 21x are provided in a thin wall of the insulating tube 21, a time period in which a wall surface around the fine ejection hole 21x is in contact with the gas passing therethrough can be made very short, and the contact area between the gas and a portion around the ejection hole 21x can be made very small. The ejection hole 21x having a nozzle configuration ejects the gas to the hollow portion 21A by using an adiabatic expansion effect. Accordingly, the plasma excitation gas can be led to the hollow portion 21A while the amount of attenuation of the plasma excitation gas due to collision of the plasma excitation gas in the ejection hole 21x and the amount of attenuation of the plasma excitation gas due to heat generation are suppressed as small as possible.

Thus, the gases, which have been supplied into the discharge space 6 of the electrode cell whose outer shape is circular in a plan view, move radially inward to the central portion of the electrode cell. During this movement, the gasses are exposed to the dielectric barrier discharge, so that the plasma excitation gas and the metal functional material gas are generated. The generated plasma excitation gas, metal functional material gas, and the like, are ejected into the hollow portion 21A of the insulating tube 21 placed in the central portion of the electrode cell under a state where the amount of attenuation of these gasses are suppressed as much as possible. Then, the gasses join together in the hollow portion 21A.

The pressure of the hollow portion 21A has been reduced to the degree of vacuum that is effective for film formation. Therefore, in the hollow portion 21A in which the pressure has been reduced to vacuum, the plasma excitation gas ejected from the plurality of ejection holes 21x join together. Accordingly, such joining can suppress collision between gas particles as compared with joining in the air (that is, the amount of attenuation is considerably suppressed).

The plasma excitation gas, due to the suction force exerted by the pressure reducer 27, the functional material gas, and the like, which have joined together in the hollow portion 21A, pass through the hollow portion 21A and the gas output flanges 14b, 14c and then are ejected into the CVD chamber 200. The processing object material 18 is placed in the CVD chamber 200, as described above.

The above-described configuration adopts the discharge space 6 having a doughnut shape, and discharge cells are stacked. Therefore, a large amount plasma excitation gas can be generated. Moreover, a structure that allows a gas containing an activated gas, a precursor gas, and a fine metal particles to be supplied as the source gas is adopted. Such a configuration can output a special plasma excitation gas with a high concentration.

The plasma generation apparatus 100 is adopted that ejects the plasma excitation gas through the plurality of fine ejection holes 21x into the hollow portion 21A, causes the ejected plasma excitation gas to join together in the hollow portion 21A whose pressure has been reduced to vacuum, and suppresses the amount of attenuation of the plasma excitation gas as much as possible. Accordingly, the processing object material 18 is exposed to a large amount plasma excitation gas (or the functional material gas, etc.) with a high concentration. In a short time, a predetermined surface process (film formation process) such as oxidation or nitriding is performed on the processing object material 18 in accordance with the types of the plasma excitation gas and the functional material gas.

For example, in a case where nitrogen gas or an activated gas containing nitrogen atoms is adopted as the source gas, nitrogen radical is generated in each discharge space 6 and a nitriding reaction is caused with interposition of the precursor gas, so that a highly functional nitride film is formed on the processing object material 18. In a case where oxygen gas or an activated gas containing oxygen atoms is adopted as the source gas, oxygen radical (such as O atoms) is generated in each discharge space 6 and an oxidation reaction is caused with interposition of the precursor gas, so that a highly functional oxide film is formed on the processing object material 18.

As seen from the description thus far given, the plasma generation apparatus 100 and the CVD chamber 200 constitute a film formation processing apparatus of remote plasma type (a CVD apparatus of remote plasma type).

Next, effects of the invention of this embodiment will be described.

As described above, too, the conventional technique mixes an active gas, a metal precursor gas, and the like, with a nitrogen gas, an oxygen gas, a rare gas, and the like, that are inactive at a normal temperature, and supplies the mixed gas as the source gas into the housing in which the electrode cell is arranged. This causes the mixed gas to permeate a region of the electrode cell other than the discharge space. As a result, the problems arise that a power feed part and a surface of an electrode are corroded by the active gas and that a deposition is generated in a place other than the discharge space because of the metal precursor gas.

Therefore, the plasma generation apparatus 100 according to the present invention includes the pipe passage 75 that is not connected to a space within the housing 16 where the electrode cells are not arranged and that directly supplies the source gas from the outside of the housing 16 into each discharge space 6.

Accordingly, apart from the inert gas and the like supplied from the gas supply part 20, the active gas, the metal precursor gas, and the like, can be supplied through the pipe passage 75 into each discharge space 6, without contacting with a space within the housing 16 other than the discharge space 6. This can prevent the active gas from contacting an electrode portion of the electrode cell, and can prevent the active gas from corroding the electrode portion. Since the metal precursor gas is directly supplied to the discharge space 6, generation of a deposition caused by the metal precursor gas in a space within the housing 16 other than the discharge space 6 can be prevented, too. Therefore, in the plasma apparatus 100 according to the present invention, troubles such as the corrosion and the deposition do not occur. Thus, the lifetime of the apparatus can be prolonged, and a stable operation is achieved.

In order prevent corrosion of the activated gas, it is desirable to provide a corrosion resistance to the pipe passage 75 (including the parts 75a, 75b) by, for example, forming a passive film over the whole of the inner wall of the pipe passage 75. In order to prevent occurrence of a dew condensation of the metal precursor gas in the pipe passage 75, it is desirable to provide a temperature adjuster for adjusting and keeping the temperature within the pipe passage 75. For example, a passage through which a liquid whose temperature has been adjusted flows is provided in the connection block 9 and in the low-voltage electrode 1.

In this embodiment, the pressure reducer 27 generates the pressure difference $\Delta P$ (=Pa−Pb) between the discharge space 6 and the hollow portion 21A, and due to the pressure difference $\Delta P$, the plasma excitation gas, the functional material gas, and the like, are led into the hollow portion 21A of the insulating tube 21 arranged in a central region of the electrode cell.

This can suppress occurrence of collision among the plasma excitation gases in a region from the discharge space 6 to the hollow portion 21A, and also suppress occurrence of collision of the plasma excitation gas with a wall and the like. Therefore, the amount of attenuation caused by collisions of the plasma excitation gas can be suppressed. This enables the plasma excitation gas to be more efficiently extracted into the hollow portion 21A.

In the invention of this embodiment, the pressure reducer 27 can set the pressure in the hollow portion 21A of the insulating tube 21 to a value equal to or less than several thousand of Pa. Accordingly, the plasma excitation gas ejected into the hollow portion 21A can be supplied into the CVD chamber 200 while collision among the plasma excitation gases is suppressed. Therefore, the amount of attenuation caused by collision among the plasma excitation gases can be reduced. As a result, the concentration and the flow rate of the plasma excitation gas, to which the processing object material 18 placed in the CVD chamber 200 will be exposed, can be kept high.

In the present invention, the plasma excitation gas is generated by using the dielectric barrier discharge that enables injection of discharge energy having a high energy density. It has been revealed that, when dielectric barrier discharge occurs under a state where the discharge space is in a vacuum state in which the pressure is equal to or lower than an absolute pressure 30 kPa, it is difficult to stably obtain discharge plasma having a high energy density, because the gas density is low. In this respect, the present invention adopts a structure in which the pressure difference $\Delta P$ is generated between the discharge space 6 and the hollow portion 21A in a vacuum state in which the pressure is equal to or lower than the absolute pressure 30 kPa.

Accordingly, in the present invention, dielectric barrier discharge with a pressure equal to or higher than the absolute pressure 30 kPa, which enables injection of discharge energy having a high energy density, can be performed. Therefore, even when the plasma generation apparatus 100 is made compact, a large amount of plasma excitation gas with a high concentration can be generated.

Moreover, in the present invention, the electrode cells for generating the dielectric barrier discharge are stacked in multiple stages, and the plasma excitation gas generated in the discharge space 6 of each electrode cell is ejected through the ejection hole 21x of the insulating tube 21 to the hollow portion 21A having a vacuum state. Furthermore, the present invention adopts a configuration in which the ejected plasma excitation gases join together in the hollow portion 21A having the vacuum state, and the plasma excitation gases having joined together is led to the CVD chamber 200. This can suppress the amount of attenuation caused by collisions of the plasma excitation gas. Thus, a large amount of plasma excitation gas with a higher concentration can be led to the CVD chamber 200.

In this embodiment, small ejection holes 21x are formed through the insulating tube 21. This can suppress entry of electrically-charged particles (ions or electrons) generated in the discharge space 6 into the hollow portion 21A of the insulating tube 21.

In the invention of the present application, a film formation processing apparatus of remote plasma type is provided. That is, the plasma generation apparatus 100 that generates the plasma excitation gas from the source gas and the CVD chamber 200 that performs the film formation process on the processing object material 18 by using the generated plasma excitation gas are separate and different apparatuses.

Since a plasma generation source and a processing region are completely separated, occurrence of collision of ions generated by dissociation in the plasma source with the processing object material 18 arranged in the processing region can be prevented. This can completely eliminate damages to the processing object material 18 caused by plasma. Additionally, the plasma excitation gas generated in a large amount and with a high concentration can be supplied to the CVD chamber 200, and a plasma CVD process can be performed in the CVD chamber 200, with the amount of attenuation of the plasma excitation gas being small. This can shorten the time period for formation of a film on the processing object material 18.

In the plasma generation apparatus 100 according to this embodiment, each discharge space 6 is connected to the auto pressure controller 26 via the pipe passage 22 that exists between the insulating tube 21 and an end portion of the discharge space 6 at the outlet side.

Accordingly, it is easy for the plasma generation apparatus 100 to regulate and keep the pressure of each discharge space 6 to a constant value. Since the plasma generation apparatus 100 is configured to regulate the pressure of the discharge space 6 to a desired pressure, it is easy to regulate, set, and keep the pressure so as to optimize the performance of generation of the plasma excitation gas or the like. In the plasma generation apparatus 100, more stable dielectric barrier discharge can be generated under a state where the pressure in each discharge space 6 is kept constant. Therefore, in each discharge space 6, the plasma excitation gas having a uniform excitation level is generated. As a result, a functional film having a higher quality is formed on the processing object material 18 in the CVD chamber 200.

In the plasma generation apparatus 100 according to this embodiment, the passage through which the cooling medium whose temperature has been adjusted to a constant temperature flows is formed in the low-voltage electrode 1.

Accordingly, heat generated in the electrode cell due to the dielectric barrier discharge can be dissipated through the cooling medium, so that the temperature of the low-voltage electrode 1 itself can be easily regulated and kept to the constant temperature.

Additionally, since the low-voltage electrode 1 is kept to the constant temperature, the temperature of the gas in each discharge space 6 can be also easily regulated and kept almost to the constant temperature. For example, the temperature of the gas in each discharge space 6 is regulated and set so as to optimize the performance of generation of the plasma excitation gas. In the plasma generation apparatus 100, the dielectric barrier discharge can be caused under a state where the temperature of the gas in each discharge space 6 is set constant (particularly, it has been confirmed from experiments that a low temperature causes generation of a plasma excitation gas with a high concentration). In each discharge space 6 in which plasma conditions such as the temperature of the gas and the pressure of the gas are set constant, a plasma excitation gas having a relatively uniform excitation level (energy level) is generated. Therefore, a functional film having a higher quality is formed on the processing object material 18 in the CVD chamber 200.

When, instead of the cooling medium, a liquid whose temperature has been adjusted to, for example, 100° C. or higher is caused to flow through the passage formed in the low-voltage electrode 1 and the like, generation of a dew condensation in the discharge space 6, which may be otherwise caused by the metal precursor gas, can be prevented.

The plasma generation apparatus 100 according to this embodiment includes not only the gas MFC 24 but also the sub gas MFC 25 that outputs the rare gas. A predetermined gas and the rare gas are mixed, and then supplied from the gas supply part 20 into the housing 16.

Accordingly, in a path of movement of the plasma excitation gas, attenuation of active species due to collision among the plasma excitation gases is suppressed by the rare gas. Therefore, the concentration and the flow rate of the plasma excitation gas supplied into the CVD chamber 200 are increased. That is, the plasma excitation gas can be efficiently extracted.

In the plasma generation apparatus 100 according to this embodiment, a plurality of electrode cells are provided, and the electrode cells are stacked in the direction in which they face each other. The stack of electrode cells have, at a central region thereof, the continuous through hole extending in the stacking direction. In the continuous through hole, the insulating tube 21 extending in the stacking direction is arranged.

Accordingly, a plasma excitation gas, a functional material gas, and the like, can be generated from the plurality of electrode cells, and the generated plasma excitation gas and the like can be caused to join together in the hollow portion 21A of the insulating tube 21. This enables the plasma excitation gas and the like having a high flow rate to be extracted in the hollow portion 21A. Thus, the processing object material 18 can be exposed to the plasma excitation gas and the like having the high flow rate. Since the electrode cells are stacked in the vertical direction of FIGS. 1 and 2, it is possible to considerably increase the amount of generated plasma excitation gas without increasing the area occupied by the plasma generation apparatus 100.

It may be acceptable that a shower plate is arranged at the end side of the insulating tube 21. To be more specific, a configuration shown in a perspective view on an enlarged scale of FIG. 3 may be adopted as the gas output flange 14c shown in FIG. 1 that is connected to the CVD chamber 200 side.

Figure 3:
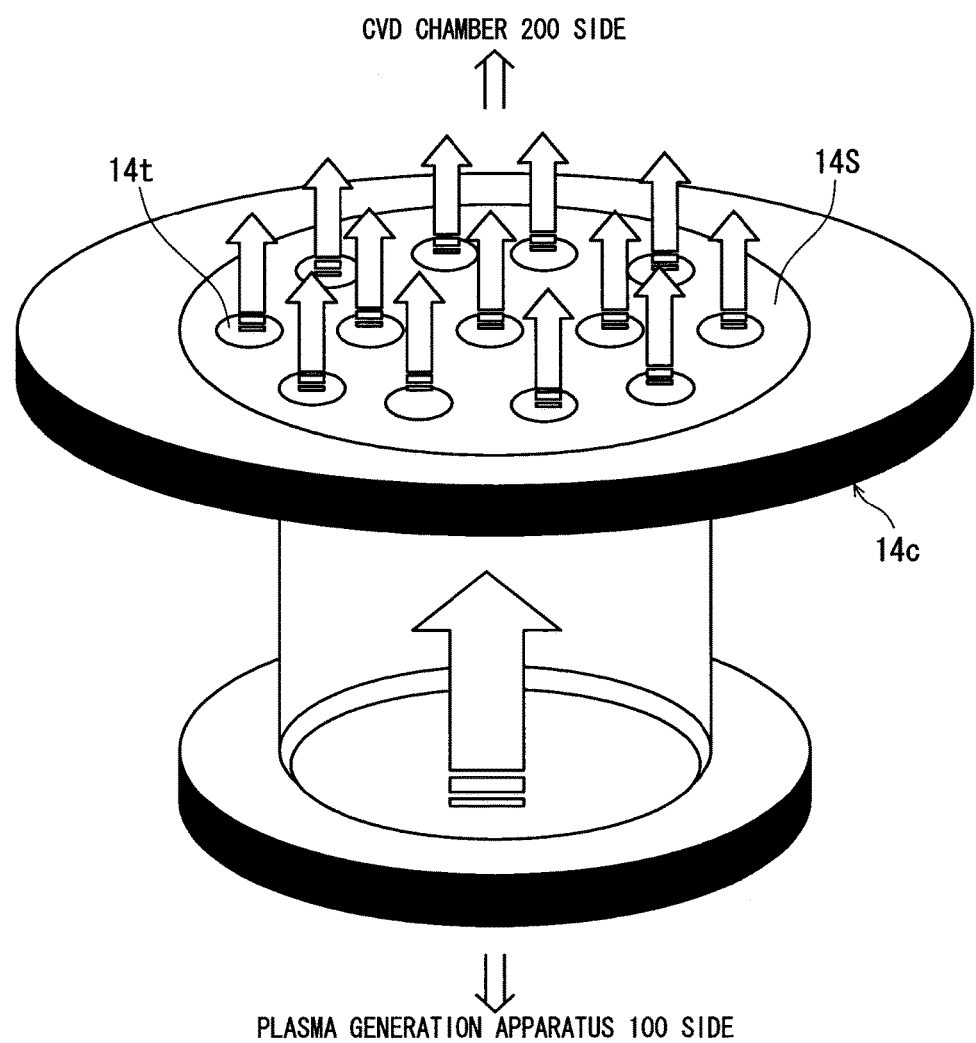
FIG. 3 A perspective view showing, on an enlarged scale, a configuration of a gas output flange 14c.

As shown in FIG. 3, the gas output flange 14c has a shower plate 14S. The shower plate 14S has a plurality of ejection holes 14t formed therethrough.

The plasma excitation gas, the functional material gas, and the like, generated in the plasma generation apparatus 100 are ejected to the hollow portion 21A of the insulating tube 21, passes through the hollow portion 21A and the gas output flange 14b at the plasma generation apparatus 100 side, and reach the gas output flange 14c at the CVD chamber 200 side.

In the gas output flange 14c, a buffer chamber having a large capacity is provided adjacent to the shower plate 14S. Thus, in FIG. 3, an upper surface of the buffer chamber serves as the shower plate 14S.

The plasma excitation gas, the functional material gas, and the like, reach the gas output flange 14c, and in the gas output flange 14c, once permeate the buffer chamber having the large capacity. Then, the plasma excitation gas and the like are supplied from the buffer chamber into the CVD chamber 200 through the plurality of ejection holes 14t formed in the shower plate 14S.

Adoption of the gas output flange 14c having the configuration shown in FIG. 3 enables the plasma excitation gas, the functional material gas, and the like, to be uniformly supplied from the ejection holes 14t of the shower plate 14S into the CVD chamber 200. Accordingly, even when the processing object material 18 having a large area is placed in the CVD chamber 200, a surface of the processing object material 18 having the large area can be uniformly exposed to the plasma excitation gas and the like (the plasma excitation gas and the like can be uniformly ejected to surface of the processing object material 18 having the large area). The uniform ejection of the plasma excitation gas and the like allows a uniform film having a high quality to be formed on the surface of the processing object material 18 having the large area.

<Embodiment 2>

In this embodiment, application of a plasma apparatus according to the present invention to a plasma-treated particle generation apparatus will be described. The plasma-treated particle generation apparatus is used for an application other than a film formation process in semiconductor manufacturing and the like. For example, a metal material is exposed to discharge plasma in the plasma-treated particle generation apparatus, and thereby the metal material can be modified into new functional material (such as an amorphous material).

Figure 4:
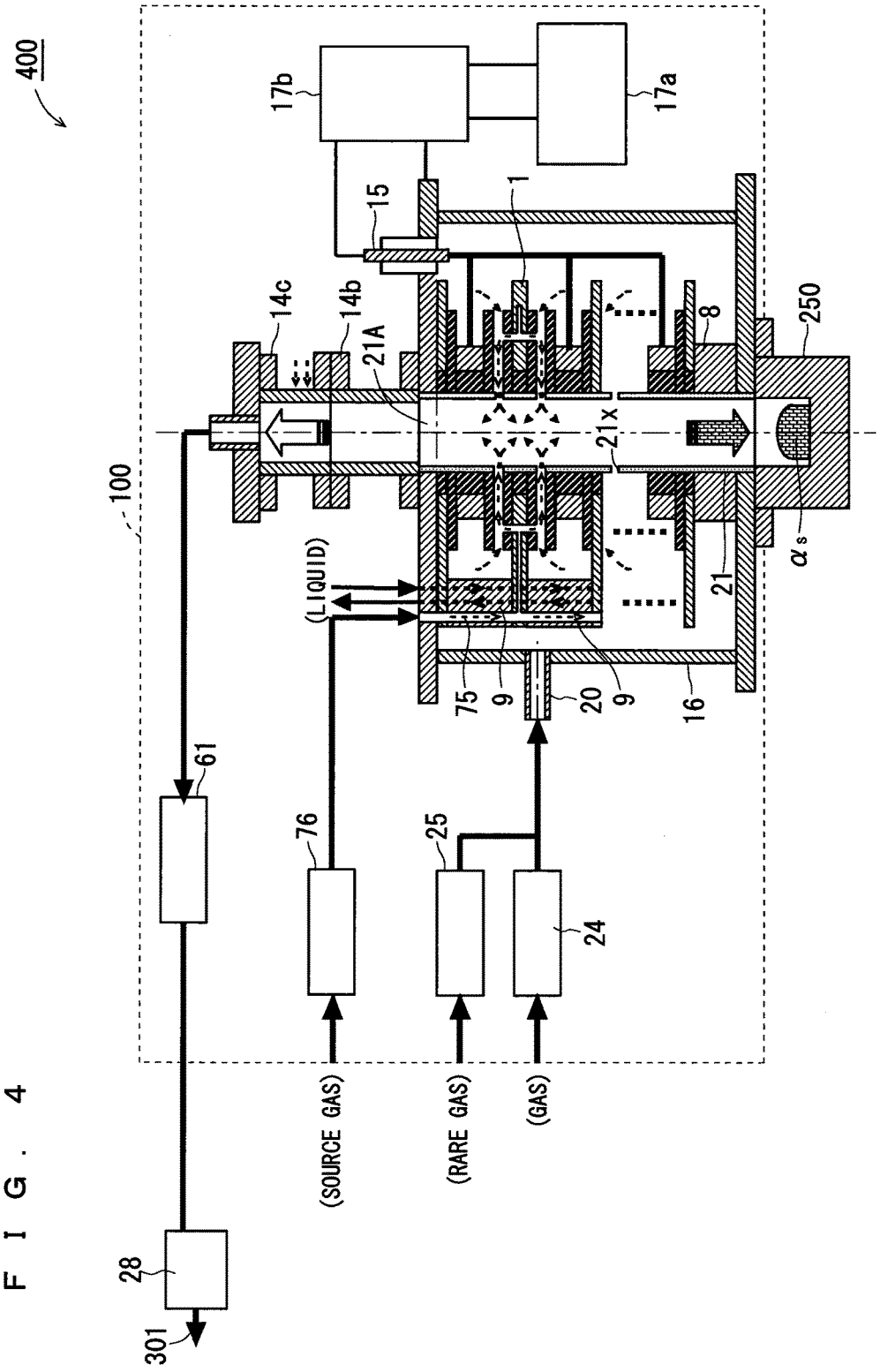
FIG. 4 A cross-sectional view showing an overall configuration of a plasma-treated particle generation apparatus according to an embodiment 2.

FIG. 4 is a cross-sectional view showing a configuration of a plasma-treated particle generation apparatus 400 according to this embodiment. An electrode cell according to this embodiment has the same configuration as the configuration shown in FIG. 2. In a configuration shown in FIG. 4, unlike the configuration shown in FIG. 1, the auto pressure controller 26 and the pipe passage 22 are not provided.

The insulating tube 21 shown in FIG. 4 may be omitted, too. In such a case, it can be considered that portions of the insulating plate 4, the dielectrics 2a, 2b, and the insulators 1a, 3a, 5a facing the continuous through hole described in the embodiment 1 constitute a member that can be regarded as the insulating tube 21. Additionally, it can be considered that an end portion of the discharge space 6 facing the continuous through hole serves as the ejection hole 21x.

As shown in FIG. 4, the plasma-treated particle generation apparatus 400 includes a plasma generation apparatus 100, a processed material collection flange 250, and an exhaust gas decomposition processor 28.

A configuration of the plasma generation apparatus 100 according to the present invention will be described.

Most of the configuration of the plasma generation apparatus 100 according to the embodiment 2, including the configuration (the configuration shown in FIG. 2) of the electrode cell, is the same as the configuration of the plasma generation apparatus 100 according to the embodiment 1. Therefore, in this embodiment, parts of the configuration of the plasma generation apparatus 100 different from the embodiment 1 will be described.

Firstly, unlike the plasma generation apparatus 100 according to the embodiment 1, the plasma generation apparatus 100 according to this embodiment do not include the auto pressure controller 26 and the pipe passage 22, as described above.

As described in the embodiment 1, a passage (not shown) through which a liquid (a cooling medium such as water) passes is formed in each of the connection blocks 9 stacked in the vertical direction of FIGS. 2 and 4, and a passage (not shown) is formed in each high-pressure cooling plate 5 and in each low-voltage electrode 1, too. As for the high-pressure cooling plate 5 and the low-voltage electrode 1 of the embodiment 1 and this embodiment, two plates each having a groove formed in one surface thereof are bonded to each other, and thereby a single high-pressure cooling plate 5 or a single low-voltage electrode having a passage (not shown) for the cooling medium formed therein is prepared.

As described in the embodiment 1, too, the cooling medium whose temperature has been adjusted to the constant temperature flows through the passages formed within the high-pressure cooling plate 5 and the low-voltage electrode 1, and thereby the high-pressure cooling plate 5 and the low-voltage electrode 1 themselves are cooled and kept to the constant temperature, and the temperature in the discharge space 6 can be indirectly kept to the constant temperature. The temperature of the cooling medium is adjusted to a constant temperature in a range of about several ° C. to 25° C.

In some cases, it may be preferred that, in accordance with the types of the fine metal particles contained in the source gas and the precursor gas containing object metal atoms, not a cooling medium but a liquid having a relatively high temperature is caused to flow through the passages formed within the high-pressure cooling plate 5 and the low-voltage electrode 1, and the like. This is for, for example, preventing occurrence of a dew condensation of the metal particles in the discharge space 6.

The liquid having the relatively high temperature is a liquid whose temperature has been adjusted to a constant temperature in a temperature range of about 100° C. to 200° C. The liquid, which is supplied from the outside, flows through the passage formed within the connection block 9, circulates through the passage formed within each high-pressure cooling plate 5 and the passage formed within each low-voltage electrode 1, and is outputted to the outside through another passage formed within the connection block 9.

The liquid whose temperature has been adjusted to a constant temperature is caused to flow through the passages formed within the connection block 9, the high-pressure cooling plate 5, the low-voltage electrode 1, and the like, and thereby the connection block 9, the low-voltage electrode 1, and the like, are kept at the constant temperature. Furthermore, the temperature within the discharge space 6 is indirectly kept at the constant temperature, too, via the low-voltage electrode 1.

In this manner, in accordance with the types of the fine metal particles contained in the source gas and the precursor gas containing object metal atoms, a cooling medium or a liquid having a relatively high temperature is caused to flow through the passages formed within the high-pressure cooling plate 5, the low-voltage electrode 1, and the like.

In this embodiment as well, the pipe passage 75 for supplying the source gas to the discharge space 6 is arranged in the connection block 9 and the low-voltage electrode 1 (see FIGS. 2 and 4). Similarly to the embodiment 1 (the same configuration as shown in FIG. 2), the pipe passage 75 is not connected to a space within the housing 16 where the electrode cell is not arranged, and directly connected from the outside of the housing 16 to the discharge space 6. That is, the source gas flowing through the pipe passage 75 is not supplied to an outer circumferential region of the electrode cell within the housing 16, but directly supplied to each discharge space 6 of each electrode cell.

In this embodiment, similarly to the embodiment 1, the pipe passage 75 is connected to the source gas MFC 76 arranged in the outside of the housing 16 (see FIG. 4). In this embodiment, the plasma generation apparatus 100 is applied to the plasma-treated particle generation apparatus 400. Therefore, in the source gas MFC 76 according to this embodiment, a gas containing fine metal particles each having a size of about several microns is supplied as the source gas to the pipe passage 75. Although the source gas MFC 76 is provided in the example illustrated herein, the source gas MFC 76 may be omitted.

As the fine metal particles (fine particle powder), metal powder of an iron group element such as iron, nickel, or cobalt, metal powder of a rare-earth element such as samarium or neodymium, metal powder of a transition metal element such as titanium, tungsten, or niobium, or alloying metal powder of these metal elements, is adopted. As the gas that carriers the fine metal particles, an inert gas such as an oxygen gas or a nitrogen gas is adopted. An active gas such as an ozone gas, an ammonia gas, or a nitrogen oxide gas may be adoptable as the gas that carries the fine metal particles. A rare gas may be also adoptable as the gas that carries the fine metal particles.

In this embodiment as well, the plurality of electrode cells are arranged in a stacked state within the housing 16 (see FIG. 4). In this embodiment as well, the stack of electrode cells is firmly fixed to the upper surface of the housing 16 by a fastening member 8.

In this embodiment, however, the insulating tube 21 is arranged to penetrate the fastening member 8 and also penetrate the lower surface of the housing 16. No ejection hole 21x is formed in a portion of the insulating tube 21 that is adjacent to the fastening member 8. There is a space between the side surface of the housing 16 and the side surface of each electrode cell. There is also a space between the bottom surface of the housing 16 and the lowermost portion of each electrode cell.

In this embodiment, the plasma generation apparatus 100 includes an auto pressure controller 61 instead of the pressure reducer 27. The auto pressure controller 61 is connected to the hollow portion 21A of the insulating tube 21 via the gas output flanges 14b, 14c, as shown in FIG. 4. In this configuration, the auto pressure controller 61 keeps the hollow portion 21A and the discharge space 6 to a constant pressure (that is, in this embodiment, the auto pressure controller 61 also has the function of the auto pressure controller 26 that adjusts the pressure of the discharge space 6 as described in the embodiment 1). For example, the auto pressure controller 61 keeps the pressure of the hollow portion 21A and the discharge space 6 to a constant pressure in a pressure range of 0.03 MPa (mega Pascal) to 0.3 MPa.

The auto pressure controller 61 is, at one side thereof, connected to the hollow portion 21A side, and, at the other side thereof, connected to the exhaust gas decomposition processor 28 described in the embodiment 1.

The configuration of the plasma generation apparatus 100 according to this embodiment is as described above. The plasma-treated particle generation apparatus 400 according to this embodiment includes a processed material collection flange 250 instead of the CVD chamber 200 described in the embodiment 1.

In this embodiment, the insulating tube 21 penetrates the lower surface of the housing 16, as described above (FIG. 4). Accordingly, an end portion of the insulating tube 21 is exposed from the lower surface of the housing 16 (that is, the hollow portion 21A of the insulating tube 21 faces the outside from the lower surface of the housing 16). The processed material collection flange 250 is firmly fixed to the lower surface of the housing 16 at the outside of the housing 16 such that the processed material collection flange 250 is connected to the hollow portion 21A. The fine metal particles modified through the plasma process performed in the discharge space 6 pass through the hollow portion 21A, and are deposited in the processed material collection flange 250.

Next, an operation of the plasma-treated particle generation apparatus 400 according to this embodiment, including an operation of the plasma generation apparatus 100, will be described.

Conventional techniques for modifying metal particles by using discharge include a plasma jet apparatus and a DC glow discharge apparatus. These apparatuses adopt a technique using continuous plasma, and it is difficult that heated fine particles heated by plasma are modified (for example, an amorphized material is generated) by rapid cooling.

In this respect, the plasma generation apparatus 100 according to this embodiment uses dielectric barrier discharge, which is intermittent discharge. Therefore, imbalanced plasma is generated in the discharge space 6, and it is possible that fine metal particles plasma-processed and heated in the discharge space 6 are rapidly cooled. Thus, the plasma generation apparatus 100 according to this embodiment is suitable for modification of the fine metal particles (for example, generation of an amorphized material).

Referring to FIG. 4, a source gas containing fine metal particles is supplied from the source gas MFC 76. The fine metal particles may be supplied together with an active gas of ozone, ammonia, nitrogen oxide, or the like. The fine metal particles may be also supplied together with inert gas of oxygen, nitrogen, or the like. Alternatively, the fine metal particles may be supplied together with a rare gas or the like. The supplied source gas is inputted to the pipe passage 75, passes through the pipe passage 75, and is directly supplied to each discharge space 6 through the low-voltage electrode 1 (that is, the source gas is supplied to the discharge space 6 without contacting a space within the housing 16 other than the discharge space 6).

The gas MFC 24 supplies an inert gas of oxygen, nitrogen, or the like, and the sub gas MFC 25 supplies a rare gas. The supplied inert gas and rare gas join and mix together before they are inputted to the gas supply part 20. The mixed inert gas and rare gas are supplied from the gas supply part 20 into the housing 16 of the plasma generation apparatus 100.

The supplied inert gas and rare gas permeate the inside of the housing 16. The inert gas and the like having diffused in the housing 16 enter the discharge space 6 formed in each electrode cell from the outer circumferential side of the electrode cell whose outer shape is circular in a plan view. Adoption of a configuration that allows such a gas flow can prevent the gas containing the fine metal particles that has been ejected into the discharge space 6 from flowing back to a space within the housing 16 other than the discharge space 6.

As shown in FIG. 4, in each electrode cell, the AC power source 17 applies a high-frequency AC voltage between the high-voltage electrode 3 and the low-voltage electrode 1. Application of the AC voltage to the electrodes 1, 3 causes dielectric barrier discharge (silent discharge) with high-frequency plasma to uniformly occur in the discharge space 6 of each electrode cell.

In the discharge space 6 where the dielectric barrier discharge is occurring, the source gas and the like are supplied as described above. As a result, due to the dielectric barrier discharge, a plasma excitation gas such as nitrogen radical or oxygen radical is generated in the discharge space 6. An imbalanced-plasma chemical reaction between the generated plasma excitation gas and the fine metal particles, which is a feature of the dielectric barrier discharge, is effectively promoted in the discharge space 6. This chemical reaction results in modification of the fine metal particles themselves, and the modified particles are outputted to the hollow portion 21A.

In the following, a detailed description will be given to a reaction in the discharge space 6, and the like. As described above, depending on the type of the fine metal particles, it may be sometimes preferable that the liquid causes to flow through the passage formed within the low-voltage electrode 1 and the like is a liquid whose temperature has been adjusted to, for example, 100° C. or higher. In the following, a case where a cooling medium (for example, water) is caused to flow through the passage will be described.

Figure 5:
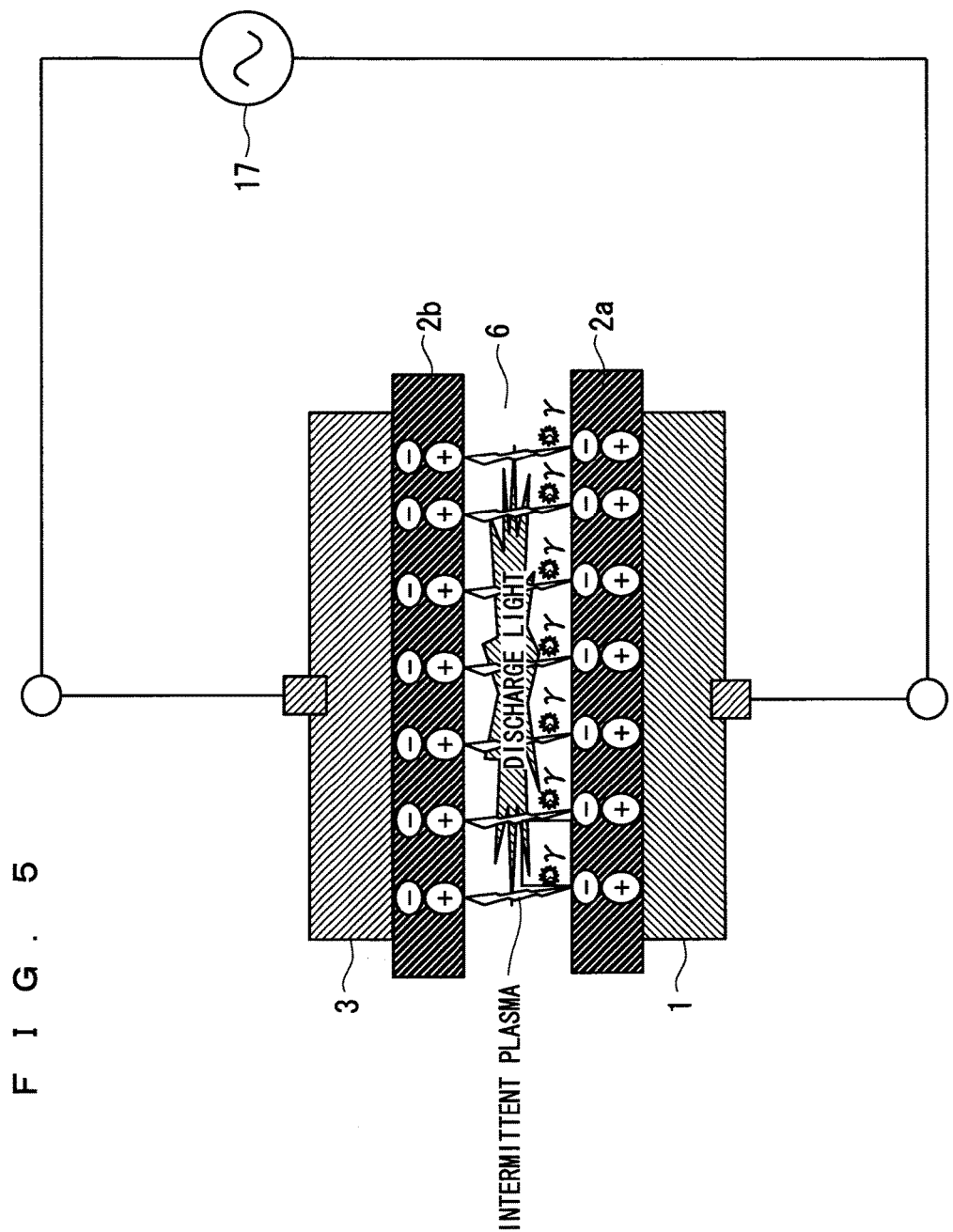
FIG. 5 A cross-sectional view on an enlarged scale for explaining an operation of a plasma generation apparatus 100 according to the embodiment 2.
Figure 6:
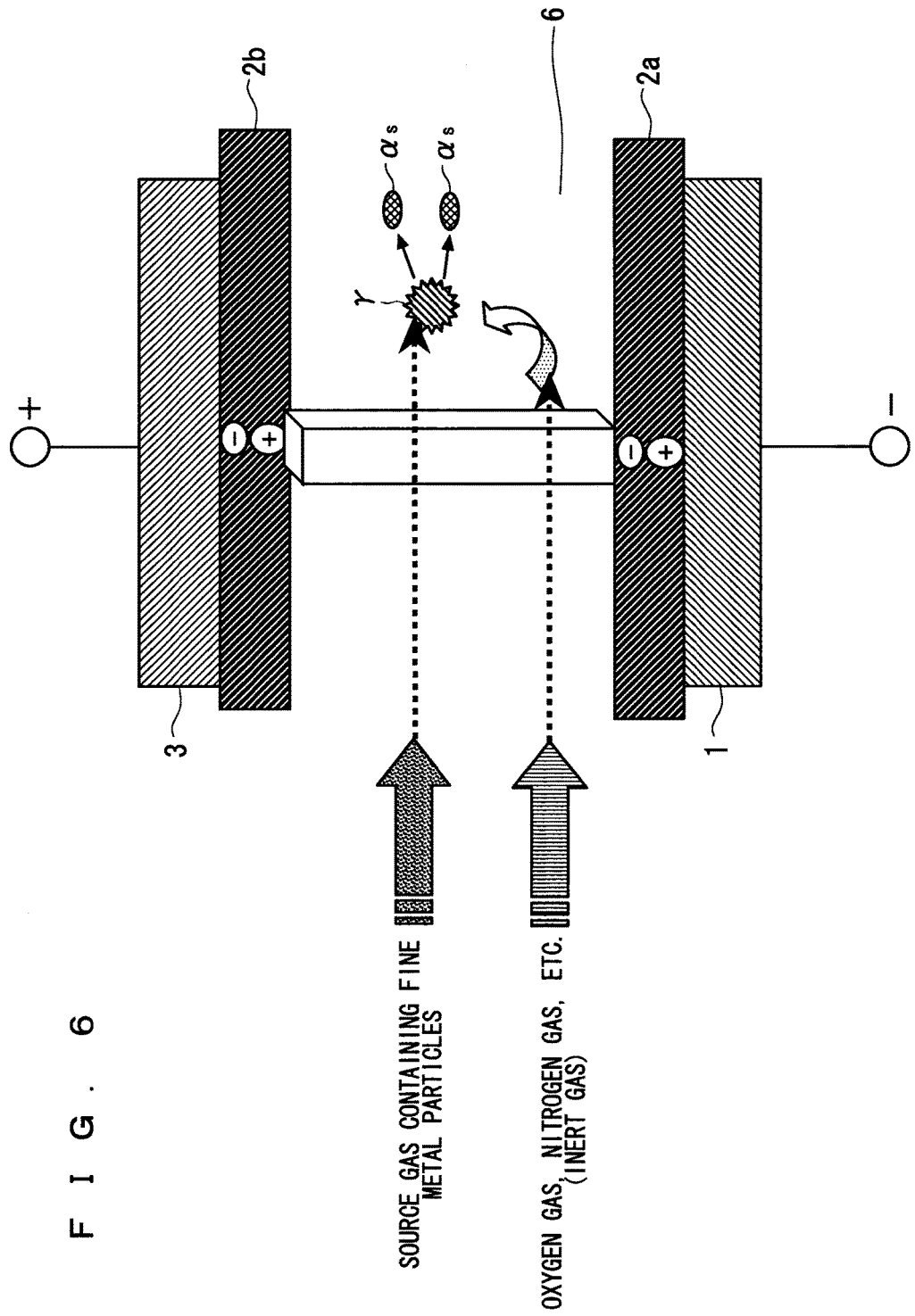
FIG. 6 A cross-sectional view on an enlarged scale for explaining the operation of the plasma generation apparatus 100 according to the embodiment 2.
Figure 7:
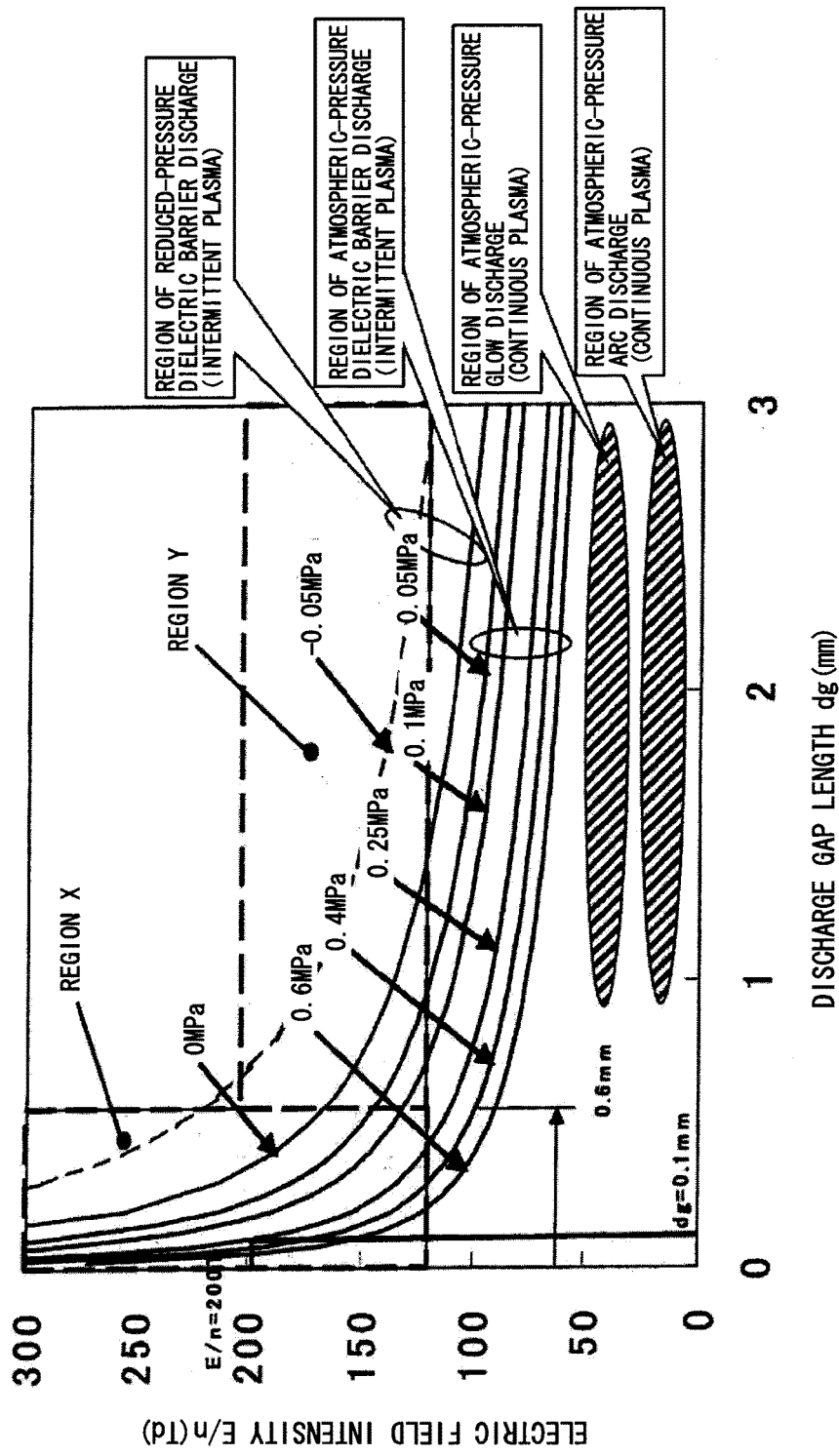
FIG. 7 A diagram for explaining the operation of the plasma generation apparatus 100 according to the embodiment 2.
Figure 8:
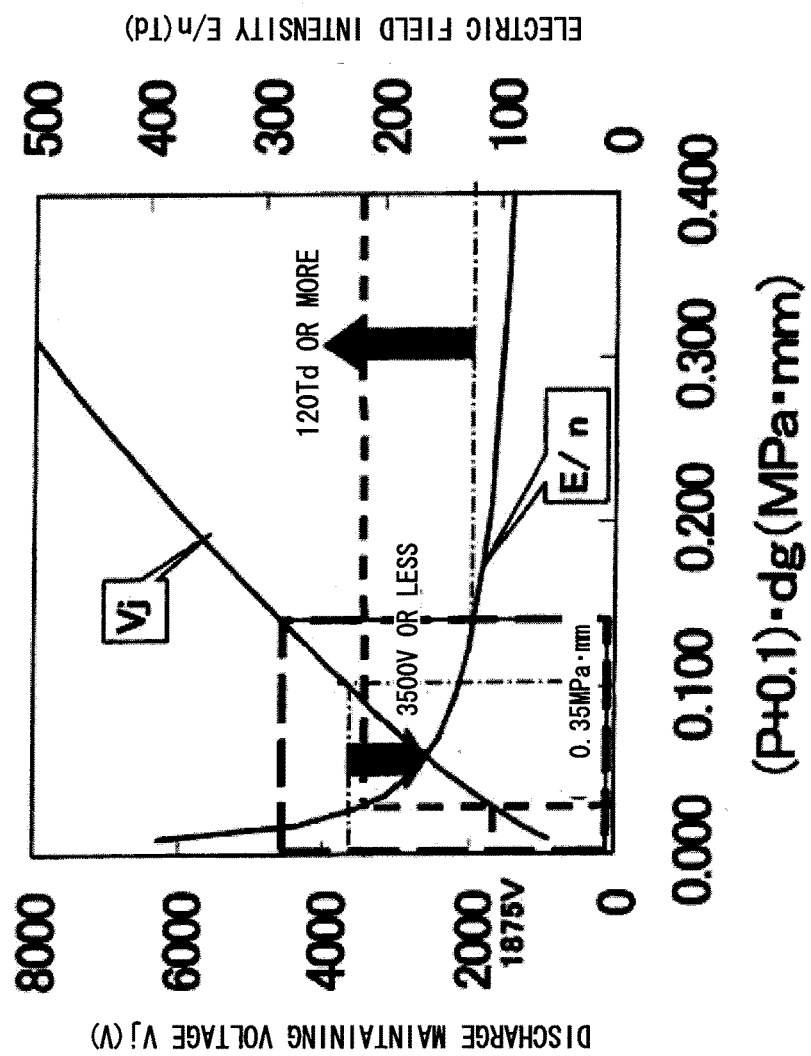
FIG. 8 A diagram for explaining the operation of the plasma generation apparatus 100 according to the embodiment 2.

FIG. 5 is a schematic diagram showing a discharge manner of the dielectric barrier discharge. FIG. 6 is a schematic diagram showing the discharge manner of FIG. 5, focusing on discharge of one fine particle. FIG. 7 is a diagram of characteristics, showing the relationship between the length of a discharge gap and the intensity of a plasma electric field of the dielectric barrier discharge. FIG. 8 is a diagram showing the relationship between a discharge maintaining voltage and a discharge plasma electric field.

The discharge maintaining voltage depends on the product of the gas pressure and the length of a dielectric barrier discharge gap.

In the plasma generation apparatus 100 according to the present invention, as described above, high-field intermittent plasma of dielectric barrier discharge is generated in the discharge space 6 instead of continuous plasma of arc discharge, glow discharge, or the like. When an inert gas of oxygen, nitrogen, or the like, supplied from the gas supply part 20 passes through the intermittent plasma discharge, a plasma excitation gas having an extremely high chemical reactivity is generated in the plasma generation apparatus 100. Furthermore, in the discharge space 6, a chemical reaction occurs between the plasma excitation gas having a high concentration and the fine metal particles supplied through the pipe passage 75. As a result, the fine metal particles are modified into metal nitride particles, metal oxide particles, or the like, and the modified metal particles can be modified into plasma-treated particles having a higher quality.

Firstly, a mechanism for generating plasma-treated particles having a high quality will be described.

Firstly, a magnetic material having a magnetic effect, a ferroelectric material having an extremely high relative permittivity, a photocatalyst material having a photocatalytic effect, or the like, has a crystal structure of a metal oxide compound, a metal nitride compound, a metal carbide compound, or the like, in which a metal atom is combined with an oxygen atom O, a nitrogen atom N, a boron atom B, or a carbon atom C (in general, the O, N, B, C atom is referred to as an implanted element), and serves as an effective functional material. To obtain a crystal structure of an effective functional material, not only the selection of a metal atom but also how the metal atom is bound to the implanted element plays an important role.

Particularly, how an electron in the outermost shell of the implanted element is regularly bound to an electron orbit in the outermost shell of a metal atom is important. It is generally said that, in order to obtain an effective functional material, a crystal material having regular defects is more effective as a material having a function as a semiconductor or as a magnetic material or the like than a crystallized material (a passive material, an insulator material) in which an electron of the implanted element is completely bound to an electron orbit of the outermost shell of a metal atom.

A photocatalyst material, which is an effective functional material, is a material belonging to the semiconductor field. FIG. 9 is a diagram showing the relationship between the band gap of a semiconductor and a metal oxide material in which a metal atom M and an oxygen atom O are bound to each other.

Not all of metal oxide materials shown in the table of FIG. 9 exert the photocatalytic effect. Among metal oxide materials shown in FIG. 9, only a metal oxide material having a regular structure with oxygen defect and uniform binding, in which the number of electrons of an oxygen atom is not completely sufficient relative to the number of electron voids in an electron orbit in the outermost shell of a metal atom, has a band gap that differs depending on a metal material M, and serves as a metal oxide material with a photocatalytic effect.

The photocatalyst material having such oxygen defect is able to absorb light having a light wavelength in a specific range, which depends on a difference in the metal atom. The absorbed light brings the photocatalyst material into an excited state, so that the photocatalyst material becomes a material having an extremely active catalytic action (see the absorption wavelength of the photocatalytic effect shown in FIG. 9). That is, the photocatalyst material excited as a result of light absorption exerts a photocatalytic effect including, for example, decomposition of a harmful material. The performance of the photocatalyst material for decomposition of a harmful material is largely affected not only by the light wavelength and light intensity but also by a structure of the photocatalyst material itself and whether or not a photocatalyst having less irregularity and a high quality could be obtained. The performance of the photocatalyst material for decomposition of a harmful material largely varies depending on the surface area of the photocatalyst material, and the like.

In the description give above, modifying a metal oxide with oxygen defect by means of imbalanced plasma of dielectric barrier discharge has been illustrated. When a metal having a magnetic body such as iron is adopted as the metal material and this metal is exposed to imbalanced plasma of dielectric barrier discharge to oxidize the metal defect or modify it into a metal nitride material, a material having a function as the magnetic body can be generated. The present apparatus is effective as an apparatus for causing a chemical reaction of fine metal particles in imbalanced plasma by dielectric barrier discharge to generate a large amount of special functional materials.

Here, a case is assumed in which, in DC glow discharge or AC glow discharge that generates continuous discharge plasma, a photocatalyst material is generated under the condition that the length of a discharge gap is 1 mm or more and the gas pressure is 1 atmosphere (0.1 MPa) or less. It is difficult to generate oxygen radical atoms with high energy at a high concentration by using such a discharge manner. The probability that an effective chemical reaction can occur between an oxygen radical atom and a metal atom is low. In addition, due to other factors, this discharge manner cannot provide a photocatalyst material with a good structure.

In the above, the metal oxide material having a structure with oxygen defect has been illustrated as an example of the photocatalyst material serving as a functional material. A metal compound material having a regular structure with metal atom defect is also effective for a magnetic material. Substituting an element of a conductive material different from an element of a magnetic body, such as a transition metal element, copper, or aluminum, for the defect portion results in formation of a magnetic material having an extremely high corrosion resistance and excellent magnetic properties. It is said that a metal compound material in which a copper atom regularly enter a structure of the metal compound material is effective as a superconductive material. As a method for generating such a metal compound material, a low-gas-temperature plasma generation technique that causes high field plasma and imbalanced plasma is effective.

The plasma generation apparatus 100 according to the present invention relates to a low-gas-temperature plasma generation technique that causes high field plasma and imbalanced plasma. By using a discharge manner of dielectric barrier discharge, a large amount plasma-treated particles can be generated efficiently.

Next, a phenomenon occurring in the discharge space 6 will be described with reference to FIGS. 5 to 8.

Firstly, an operation and an action of the discharge manner of the dielectric barrier discharge will be described with reference to FIG. 5.

Causing a cooling medium to circulate through the low-voltage electrode 1 and the like cools the electrode surface and the discharge space 6 to a constant temperature. As described above, the AC power source 17 applies an AC voltage between the electrodes 1, 3. Consequently, in the dielectrics 2a, 2b, electric charges are polarized at surfaces of the dielectrics 2a, 2b in a state where the phase is shifted by 90 degrees relative to the applied AC voltage, as shown in FIG. 5. That is, when an AC voltage V is applied between the electrodes 1, 3; at a time point when the value of (dV/dt) takes a maximum value, a maximum polarized electric charge Qmax is accumulated in the discharge space 6, so that a maximum electric field intensity Emax is applied to the discharge space 6.

In a case where an electric field intensity Ec that is for causing insulation breakdown in the discharge space 6 is set lower than Emax; at a time point of a polarized electric charge Qc that causes the electric field intensity Ec, partial insulation breakdown (partial discharge) occurs in the discharge space 6. Thus, the polarized electric charge Qc accumulated in the dielectrics 2a, 2b is discharged to the low-voltage electrode 1. As a result of this discharge, the polarized electric charge Qc accumulated at the surfaces of the dielectrics 2a, 2b is lost, and then promptly, the discharge is stopped, so that the partial insulation breakdown in the discharge space 6 is recovered (the discharge is stopped).

This causes the dielectrics 2a, 2b to be charged again until a time point when the polarized electric charge Qc is accumulated. Then, when the polarized electric charge reaches Qc, partial insulation breakdown (partial discharge) occurs again in the discharge space 6, so that discharge of a discharge voltage Vj is caused again.

Such an ON-OFF discharge in which the partial insulation breakdown (partial discharge) and the recovery of insulation (stop of the discharge) are repeated in the discharge space 6 is the intermittent plasma discharge, which is called dielectric barrier discharge. Electric charges are uniformly accumulated throughout the entire surfaces of the dielectrics 2a, 2b. Therefore, the dielectric barrier discharge is uniformly caused throughout the inside of the discharge space 6, though the dielectric barrier discharge is an unregulated ON-OFF discharge. Since the dielectric barrier discharge is discharge caused by electric charges accumulated on fine surfaces of the dielectrics 2a, 2b, the dielectric barrier discharge is micro discharge that continues for a short time.

One discharge diameter of the dielectric barrier discharge is about several tens of μm and a cross-section of the discharge is about several nm$^2$, though they depend on the gas pressure in the discharge space 6, the temperature of the gas, the type of the gas, and the like. As the length of a discharge gap (the vertical size of the discharge space 6 shown in FIG. 2) and the gas pressure are smaller, a time period for which one dielectric barrier discharge continues decreases. The time period for which the discharge continues is commonly about nanosecond under the condition that the length of a discharge gap is 0.1 mm and the gas pressure is about 0.1 MPa.

Then, a source gas containing an active gas such as an oxygen gas, a nitrogen gas, or a nitrogen oxide gas, and fine metal particles are supplied to the discharge space 6 where the dielectric barrier discharge is occurring, so that a plasma excitation gas is generated by the dielectric barrier discharge (intermittent plasma discharge that causes high field plasma). A mechanism for modifying fine metal particles (generating an amorphous material) by the plasma excitation gas will be described with reference to FIG. 6.

As described above with reference to FIG. 5, the dielectric barrier discharge is intermittent plasma discharge in which an enormous number of micro discharge that continues for a very short time is intermittently repeated in terms of time and space. Accordingly, the dielectric barrier discharge achieves plasma under a state where the plasma gas temperature is very low. Thus, a discharge chemical reaction that cannot be obtained by continuous discharge (continuous discharge plasma) is achieved.

Firstly, as described above, an oxygen gas, a nitrogen gas, or the like, is supplied into the discharge space 6 where the dielectric barrier discharge is occurring. Consequently, due to the dielectric barrier discharge, an active excited atom or ionized atom such as an oxygen atom or a nitrogen atom of ozone, NOx, or the like, is generated from the oxygen gas, the nitrogen gas, or the like. Here, a gas containing the active excited atom or ionized atom generated by the dielectric barrier discharge plasma will be collectively called a plasma excitation gas γ. In the discharge space 6, the plasma excitation gas γ and the fine metal particles contained in the source gas causes a chemical reaction, so that the fine metal particles themselves are modified into a very unique material state.

As shown in FIG. 6, when a predetermined AC voltage is applied between the electrodes 1, 3, a divided voltage is applied across the gap of the discharge space 6, so that discharge heat energy is generated with respect to one micro discharge. When the plasma excitation gas γ having the discharge heat energy comes into contact with the fine metal particles passing through the discharge space 6, a high energy chemical reaction is promoted in the fine metal particles.

When the generated micro discharge disappears, the fine metal particles, which have been rapidly heated up to about several hundreds of ° C. for a short time due to the high field discharge, are promptly cooled down to about the normal temperature for a short time by the cooling medium flowing through the low-voltage electrode 1. The fine metal particles exposed to the micro discharge are rapidly cooled, resulting in modification of the fine metal particles into a metal compound material in an amorphous state that maintains a liquid state (properties) which is the same state as when heated.

Simultaneously supplying an oxygen gas, a nitrogen gas, or a rare gas into the discharge space 6 causes emission of a variety of discharge light having a very high brightness which is generated from the high field discharge of the dielectric barrier discharge. A photochemical reaction caused between the light wavelength of the discharge light and the fine metal particles results in modification of the fine metal particles into a characteristic metal compound material.

Particles generated as a result of modification of the fine metal particles as described above will be referred to as plasma-treated particles αs or plasma-modified particles αs.

A case is assumed in which not only the source gas containing the fine metal particles but also a high-concentration active gas such as an ammonia gas or ozone is supplied through the pipe passage 75 to the discharge space 6. In such a case, the concentration of the plasma excitation gas γ in the discharge space 6 can be increased as compared with a case where the active gas is not supplied. The increase in the concentration of the plasma excitation gas γ enables production of a large amount of the plasma-modified particles αs.

In FIG. 7, the relationship between a gap length dg (mm) of the discharge space 6 and an electric field intensity E/n (Td) of discharge plasma is shown with respect to each of discharge manners, namely, dielectric barrier discharge, atmospheric glow discharge, and atmospheric arc discharge. FIG. 8 shows the relationship between the value of (P+0.1)·dg (MPa·mm) and a discharge maintaining voltage Vj (V) of discharge plasma, and the relationship between the value of (P+0.1)·dg (MPa·mm) and the electric field intensity E/n (Td). The value of (P+0.1)·dg (MPa·mm) is the product of the gas pressure P in the dielectric barrier discharge and a gap length dg of the discharge space 6.

In FIGS. 7 and 8, the E (V/cm) represents the voltage per a gap length of 1 cm, and the n ($cm^3$) represents the gas density in the discharge space 6. The electric field intensity being "1 (Td)" represents $1 \times 10^{17}$ (V·$cm^2$).

Normally, in continuous plasma under the atmospheric pressure (0 MPa) or higher, the value of the electric field intensity E/n caused by the discharge is 50 (Td) or less. For example, in the atmospheric pressure glow discharge, the discharge maintaining voltage is about 200 to 500V, and conversion into the electric field intensity results in about 30 to 50 Td. In the atmospheric pressure arc discharge, the discharge maintaining voltage is about several tens of V, and therefore conversion into the electric field intensity results in about 10 Td. Thus, both in the atmospheric pressure glow discharge and in the atmospheric pressure arc discharge, the electric field intensity of the discharge plasma is very low (see FIG. 7).

In contrast, in the dielectric barrier discharge which causes intermittent plasma, the discharge maintaining voltage is about several times higher than those in the glow discharge and the arc discharge that cause continuous plasma, so that the electric field intensity of the discharge plasma can be made very high (see FIG. 7). Moreover, characteristics of the electric field intensity obtained by the dielectric barrier discharge largely depend on the gas pressure in the discharge gas (this pressure is indicated with the unit "MPa" in FIG. 7) and the gap length dg of the discharge space 6 (see FIG. 7).

In the findings from the tests conducted by the inventors, the condition that enables a metal compound material such as an oxidized metal or a nitride metal to be formed with a very high quality to thereby achieve efficient film formation (short-time film formation) is that the electric field intensity E/n of the discharge plasma should be at least 120 Td. That is, as seen from FIG. 7, even in a dielectric barrier discharge region, a high field intensity of 120 Td or higher cannot be obtained under the condition that the gap length dg of the discharge space 6 is long and the gas pressure in the discharge gas is high.

In FIG. 7, when the gap length dg is set smaller than 0.6 mm under the condition that the gas pressure is 0.2 MPa, the electric field intensity E/n rapidly increases from 120 Td. For example, under the condition that the gas pressure is 0.25 MPa and the gap length dg is 0.1 mm, the electric field intensity E/n is about 200 Td. A discharge region in which the electric field intensity E/n is equal to or higher than 120 Td includes a region X and a region Y, as shown in FIG. 7. In the region X, the gap length dg is 1 mm or less. In the region Y, the gas pressure is low.

The region X shown in FIG. 7 is a range in which the gas pressure is equal to or higher than the atmospheric pressure (0 MPa) and the gap length dg is less than 1 mm. A particularly preferable conditional range was a range in which the gap length dg is 0.6 mm or less. In a case where the gap length dg is 0.6 mm or less, the electric field intensity rapidly increases from 30 Td (for example, when the gap length dg is 0.1 mm, the electric field intensity is 200 Td).

In the region Y shown in FIG. 7, even though the gap length dg is long, namely, one mm to several mm, a high field intensity of 120 Td or more can be obtained by setting the gas pressure equal to or less than 0.1 MPa. A particularly preferable gas pressure range is a reduced-pressure (vacuum) range equal to or lower than the atmospheric pressure (0 MPa).

When such discharge having a very high electric field intensity is achieved, electrons in the discharge are accelerated at a very high speed, so that the plasma in the discharge space 6 becomes imbalanced plasma, which provides discharge light that has been shifted to the high-brightness and short-wavelength side. A chemical reaction or a photochemical reaction is caused among the discharge light (such as ultraviolet light) that has been shifted to the high-brightness and short-wavelength side, the plasma excitation gas γ, and the fine metal particles contained in the gas, so that the production of the plasma-modified particles αs is promoted.

As shown in FIG. 8, as the value of (P+0.1)·dg increases, the electric field intensity E/n decreases and the discharge maintaining voltage Vj increases. It can be seen from FIG.

8 that, in a region in which the electric field intensity E/n is 120 Td or more, the value of (P+0.1)·dg is equal to or less than 0.14 (MPa·mm).

If the discharge maintaining voltage Vj is set to 3500V or higher when the plasma generation apparatus 100 according to the present invention is designed, an AC voltage of 7000V or more is necessary in order that sufficient power can be injected to the apparatus 100. This significantly increases the size of the apparatus 100. Therefore, to suppress a size increase in the apparatus, it is desirable that the value of (P+0.1)·dg is equal to or less than 0.1 (MPa·mm), only in a conditional range in which the electric field intensity E/n is equal to or more than 120 Td and the discharge maintaining voltage Vj is equal to or less than 3500V.

As thus far described, to obtain a metal compound material of high-quality fine particles (plasma-modified particles αs), the dielectric barrier discharge is effective that is able to intermittently inject high energy to a fine surface by high field discharge and by using the plasma excitation gas γ and the high energy discharge light. The plasma generation apparatus 100 according to the present invention adopts this dielectric barrier discharge.

In the plasma generation apparatus 100 according to the present invention, not only the source gas containing the fine metal particles but also the active gas such as high concentration ozone or an ammonia gas can be supplied into the discharge space 6 via the pipe passage 75. The supply of the active gas can increase the concentration of the plasma excitation gas γ, and thus the productivity of the high-quality plasma-modified particles αs is improved.

In the plasma generation apparatus 100 according to the present invention, the passage through which the temperature-adjusted liquid circulates is formed within the low-voltage electrode 1. This enables rapid cooling of the plasma-modified particles αs.

The plasma-modified particles αs generated in the discharge space 6 propagate through the discharge space 6, and are led into the hollow portion 21A through the ejection holes 21x. In addition to the plasma-modified particles αs, an unreacted gas or a gas generated aHs a result of a reaction are also led into the hollow portion 21A from each discharge space 6.

The plasma-modified particles αs (solid substances) let into the hollow portion 21A are, due to the force of gravity, collected (deposited) into the processed material collection flange 250 that is connected at the end portion side of the insulating tube 21. The gases (gaseous substances) having joined together in the hollow portion 21A pass through the hollow portion 21A and the gas output flanges 14b, 14c, and propagate into the auto pressure controller 61. Then, through the auto pressure controller 61, the gases are discharged to the exhaust gas decomposition processor 28.

The plasma-modified particles αs collected in the processed material collection flange 250 are further subjected to a heat treatment and the like, into a photocatalytic fine material, a semiconductor material, a magnetic material, a ferroelectric material, or the like, that is obtained as a result of uniform nanocrystal growth from the amorphous state. Thereby, the plasma-modified particles αs serve and are used as a high-quality functional material.

In this embodiment, the source gas containing the fine metal particles is supplied to the discharge space 6 via the pipe passage 75. A source gas containing a metal precursor gas instead of the fine metal particles may be supplied to the discharge space 6 via the pipe passage 75. In a case where the source gas containing the metal precursor gas is adopted, similarly to in the above-described case, the plasma-modified particles αs can be generated in the discharge space 6, and the plasma-modified particles αs can be collected into the processed material collection flange 250 that is connected to the end portion side of the insulating tube 21.

In a possible structure, a very fine mesh may be provided in the processed material collection flange 250 so that a small amount of gas can be discharged to the downstream of the mesh. In a case where such a mesh is provided in the processed material collection flange 250, the plasma-modified particles αs are caught at an upper surface of the mesh.

Therefore, in the invention of this embodiment, the plasma-modified particles αs can be efficiently produced and collected, and the productivity of the plasma-modified particles αs can be considerably improved. In this embodiment, the pipe passage 75 that is able to directly supply the source gas from the outside of the housing 16 to the discharge space 6 is provided. Accordingly, the source gas containing the fine metal particles, the source gas containing the metal precursor gas, and the active gas can be supplied into the discharge space 6 via the pipe passage 75. This can prevent corrosion of an electrode portion arranged within the housing 16 and deposition of metal particles in a place within the housing 16 other than the discharge space 6.

The above-described configuration enables the plasma-modified particles αs generated in the discharge space 6 to be guided into the hollow portion 21A.

In the invention of this embodiment, the plasma excitation gas is generated in the electrode cell by the dielectric barrier discharge. Accordingly, the atmospheric pressure discharge is enabled, and it is not necessary that the inside of the housing 16 of the plasma generation apparatus 100 is put into a vacuum state. The invention of this embodiment can also provide the plasma generation apparatus 100 with a simple configuration.

The plasma generation apparatus 100 can easily regulate and keep the pressure of each discharge space 6 to a constant value. Since the plasma generation apparatus 100 is configured to regulate the pressure of the discharge space 6 to a desired pressure in this manner, the regulation, setting, and keeping can be easily made such that the performance of generation of the plasma excitation gas or the like is optimized. In the plasma generation apparatus 100, the dielectric barrier discharge can be generated under a state where the pressure of each discharge space 6 is kept constant. Accordingly, the plasma excitation gas at a uniform excitation level can be generated in the respective discharge spaces 6.

In the plasma generation apparatus 100 according to this embodiment, the passage through which the liquid whose temperature has been adjusted to a constant temperature flows is formed within the low-voltage electrode 1.

Accordingly, causing a cooling medium to flow through the passage can cool the low-voltage electrode 1 itself and the inside of the discharge space 6. Thus, rapid cooling of the plasma-modified particles αs generated in this discharge space is enabled. The rapid cooling of the plasma-modified particles αs contributes to generation of high-quality plasma-modified particles αs.

Causing a liquid whose temperature has been adjusted to a temperature higher than water to flow through the passage formed within the low-voltage electrode 1 and the like can prevent occurrence of a dew condensation caused by the fine metal particles or the metal precursor gas in the discharge space 6.

In this embodiment as well, the plasma generation apparatus 100 includes the gas supply part 20 that supplies a predetermined gas from the outside of the housing 16 to the outer circumferential portion of the electrode cell within the housing 16.

Accordingly, an inert gas (such as an oxygen gas or a nitrogen gas), which does not have to be directly supplied from the outside of the housing 16 into the discharge space 6, can be supplied from the gas supply part 20.

In this embodiment as well, a predetermined gas and a rare gas can be mixed together and then supplied from the gas supply part 20 into the housing 16. Accordingly, attenuation of active species due to collision among the plasma excitation gases γ can be suppressed. Thus, a reduction in the concentration of the plasma excitation gas γ can be suppressed.

In this embodiment as well, a plurality of electrode cells are stacked in the housing 16 of the plasma generation apparatus 100. As a result of the stacking of the electrode cells, the continuous through hole extending in the stacking direction is formed in a central region of the electrode cells. The insulating tube 21 extending in the stacking direction is arranged in the continuous through hole.

Accordingly, the plasma-modified particles αs are generated in each electrode cell, and joining of the generated plasma-modified particles αs can be caused in the hollow portion 21A. Therefore, a large amount of plasma-modified particles αs can be extracted in the hollow portion 21A, resulting in collection of a large amount of plasma-modified particles αs in the processed material collection flange 250. Since the electrode cells are stacked in the vertical direction of FIGS. 4 and 2, there is no necessity to increase an area occupied by the plasma generation apparatus 100.

In the embodiment 1 and in this embodiment 2, in order to prevent the pipe passage 75 from, for example, being corroded by an activated gas having high corrosive properties such as an ozone gas, an ammonia gas, or a nitrogen oxide gas, it is desirable to process the inner wall of the pipe passage 75 (including the parts 75a, 75b) with a passive film having a corrosion resistance. In an exemplary method for preventing the corrosion and deposition, the inner surface (inner wall) of the pipe passage 75 (including the parts 75a, 75b) is made of stainless steel, and the inner surface is subjected to a chemical surface process such as electropolishing, gold plating, or passive film formation. The chemical surface process can also prevent the metal precursor gas and the like from being solidified at the inner surface of the pipe passage 75 (including the parts 75a, 75b).

In order to prevent occurrence of a dew condensation of the metal precursor gas or the fine metal particles in the pipe passage 75 (including the parts 75a, 75b), it is desirable to provide a temperature adjuster for adjusting and keeping the temperature within the pipe passage 75 (including the parts 75a, 75b). For example, a passage through which a liquid whose temperature has been adjusted flows is provided in the connection block 9 and in the low-voltage electrode 1.

<Embodiment 3>

In the plasma discharge apparatus 100 according to the embodiments 1 and 2, the gas containing the active gas and the metal precursor gas or the fine metal particles is directly supplied as the source gas into the discharge space 6 via the pipe passage 75. On the other hand, the inert gas and the rare gas are supplied via the gas supply part 20 to the outer circumferential region of the electrode cell in the housing 16. Thus, the gas containing the active gas and the metal precursor gas or the fine metal particles is prevented from flowing back to a space within the housing 16 other than the discharge space 6.

As described above, it is necessary to prevent occurrence of the troubles such as corrosion of the electrode within the housing 16, deposition of the metal particles in the discharge space 6 of the housing 16, and the like. From the viewpoint of prevention of the troubles, it is desirable to prevent the gases directly supplied into the discharge space 6 from moving from the inside of the discharge space 6 toward a radial direction centered at the pass-through PH and thus from spreading in a space between the outer circumferential portion of the electrode cell and the housing 16.

Meanwhile, in a case where an inert gas and a rare gas to the outer circumferential region of the electrode cell in the housing 16 is supplied via the gas supply part 20, the concentration of the source gas containing the active gas and the metal precursor gas or the fine metal particles is reduced in the discharge space 6. As a result, a trouble occurs that the concentration of the plasma excitation gas generated by the dielectric barrier discharge is reduced.

Considering the trouble, it is demanded that no gas be supplied from the outer circumferential region of the electrode cell in the housing 16 and that the gas such as the active gas be prevented from flowing back to a space within the housing 16 other than the discharge space 6.

Figure 10:
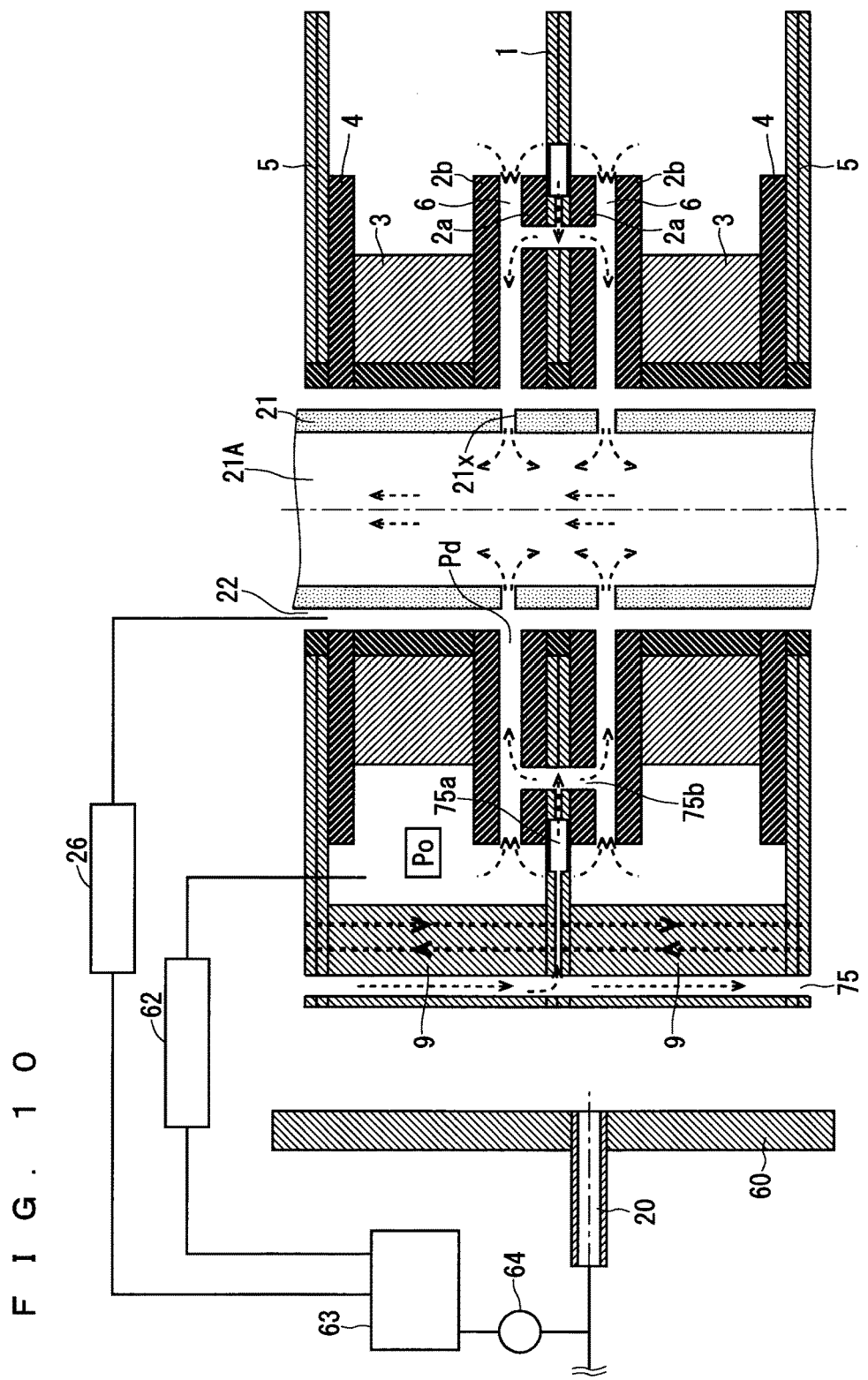
FIG. 10 A cross-sectional view showing, on an enlarged scale, a configuration of a plasma generation apparatus according to an embodiment 3.

Therefore, a plasma generation apparatus according to this embodiment has a configuration shown in FIG. 10.

As shown in FIG. 10, in the plasma generation apparatus according to this embodiment as well as in the embodiments 1 and 2, the auto pressure controller 26 (or the auto pressure controller 61) connected to the pipe passage 22 is provided. As described in the embodiments 1 and 2, the auto pressure controller 26 (or the auto pressure controller 61) keeps the pressure in the discharge space 6 to a constant value (the pressure in the discharge space 6 is set higher than the pressure in the hollow portion 21A). Needless to say, the auto pressure controller 26 (or the auto pressure controller 61) measures (monitors) the pressure in the discharge space 6 via the pipe passage 22 by a pressure control function. Hereinafter, the pressure in the discharge space 6 will be expressed as a pressure Pd.

The plasma generation apparatus according to this embodiment further includes a pressure meter 62, a pressure comparator 63, and a valve 64.

The pressure meter 62 measures a pressure in an outer circumferential region of the electrode cell in the housing 16. The outer circumferential region means a region within the housing 16 other than the region where the stack of electrode cells is arranged (that is, it means a region in the housing 16 where the stack of electrode cells is not arranged). The outer circumferential region does not include the discharge space 6.

For example, in an exemplary configuration shown in FIG. 4, the plurality of electrode cells are arranged in a stacked manner in the housing 16. The uppermost electrode cell is in contact with the upper surface of the housing 16. In a case of this configuration, the outer circumferential region with respect to the stacking direction means a space between the bottom of the lowermost electrode cell and the bottom surface of the housing 16. The outer shape of each electrode cell having the through hole PH is substantially circular in a plan view. Therefore, in the exemplary configuration shown in FIG. 4, the outer circumferential region with respect to the horizontal direction means a space between the outer circumferential end of the high-pressure cooling plate 5 and the side surface of the housing 16, a space between the outer circumferential end of the insulating plate 4 and the side surface of the housing 16, a space between the outer circumferential end of the high-voltage electrode 3 and the side surface of the housing 16, a space between the outer circumferential ends of the dielectrics 2a, 2b and the side surface of the housing 16, and a space between the outer circumferential end of the low-voltage electrode 1 and the side surface of the housing 16.

Hereinafter, a pressure in the outer circumferential region of the electrode cell in the housing 16 will be expressed as a pressure Po.

The pressure comparator 63 is connected to the auto pressure controller 26 and to the pressure meter 62. The pressure comparator 63 is also connected to the valve 64. The pressure comparator 63 obtains a first pressure measurement result Pd that is a result of measurement by the auto pressure controller 26, and a second pressure measurement result Po that is a result of measurement by the pressure meter 62. Then, the pressure comparator 63 compares the first pressure measurement result Pd and the second pressure measurement result Po with each other.

The pressure comparator 63 performs a control on the auto pressure controller 26 and/or the valve 64 such that the first pressure measurement result Pd falls below the second pressure measurement result Po.

The control on the auto pressure controller 26 performed by the pressure comparator 63 means a control for changing a control pressure value, which is controlled by the auto pressure controller 26 in order to keep the pressure of the discharge space 6 to a constant value, such that the first pressure measurement result Pd falls below the second pressure measurement result Po.

The valve 64 is arranged in a pipe passage located between the gas supply part 20 and the MFCs 24, 25. In this pipe passage, the inert gas (such as an oxygen gas or a nitrogen gas) and the rare gas outputted from the MFCs 24, 25 flow toward the gas supply part 20. The valve 64 is able to adjust the flow rate of each gas that is flowing through the pipe passage and will be inputted to the gas supply part 20. This enables the pressure Po of the outer circumferential region in the housing 16 to be always set higher than the discharge space pressure Pd by a slight pressure ΔP.

Accordingly, the control that the pressure comparator 63 performs on the valve 64 means a control for adjusting the degree of closing of the valve 64 such that the first pressure measurement result Pd falls below the second pressure measurement result Po and thereby changing the flow rate of each gas that is supplied from the gas supply part 20 into the housing 16.

As described above, in the plasma generation apparatus according to this embodiment, the pressure comparator 63 controls the auto pressure controller 26 and/or valve 64 such that the first pressure measurement result Pd falls below the second pressure measurement result Po.

Accordingly, the plasma generation apparatus according to this embodiment can prevent the gases (the gas containing the active gas and the metal precursor gas or the fine metal particles) directly supplied into the discharge space 6 from spreading (flowing back) to the outer circumferential region of the electrode cell in the housing 16. Additionally, the source gas containing the active gas and the metal precursor gas or the fine metal particles is supplied to the discharge space 6 while the concentration of the source gas is kept high without being reduced.

Here, an example case in which an ozone gas is adopted as the source gas containing the active gas will be described as an example of an embodiment 3.

In a process for forming an oxide film on a surface of a semiconductor wafer in the CVD apparatus 300, an oxygen gas or an ozone gas is used as the source gas. In the CVD chamber 200, the surface of the semiconductor wafer is exposed to activated oxygen atoms, so that film formation is performed. In the formation of such an oxide film, it has been demanded that a time period for the film formation process be shortened, that insulating properties be improved, and that the processing performance be improved. An ozone gas, from which activated atoms are easily obtained, is desired as the supplied source gas. Furthermore, an increase in the concentration and flow rate of the ozone gas is also desired.

However, the concentration of ozone obtained from an ozone generation apparatus is limited because of the principle of generation. The ozone concentration that can provide a large amount of ozone gas at a low cost is about 350 g/m$^3$ (16.3%) at a maximum. Obtaining an ozone gas having a higher concentration than this is difficult.

As described above, forming a CVD film (ozone CVD film) using the existing ozone gas as the source gas involves a problem in terms of improvement in the performance.

Therefore, the embodiment 3 is effective as measures for solving the problem of the existing method for forming an ozone CVD film. In the plasma generation apparatus 100 that is able to supply a high-concentration ozone gas, a large amount of plasma excitation gas with a higher concentration can be generated from an ozone gas by discharge. In the invention of the embodiment 3, a metal oxide gas (plasma-treated particles) for use in the film formation process is generated as a result of contact between the generated plasma excitation gas and the metal precursor gas, and the metal oxide gas (plasma-treated particles) can be supplied to the CVD chamber 200. Thus, adoption of the invention of the embodiment 3 enables formation of a large amount of oxide films having a higher quality.

Although formation of an oxide film using an ozone gas has been described above, formation of a nitride film is similar. To be more specific, in the invention of the embodiment 3, an ammonia gas or a nitrogen oxide gas serving as the source gas is inputted to the ozone generation apparatus 100 to generate a nitrogen excitation gas, and a metal nitride gas (plasma-treated particles) for use in film formation is generated as a result of contact between the nitrogen excitation gas and the metal precursor gas.

<Embodiment 4>

Figure 11:
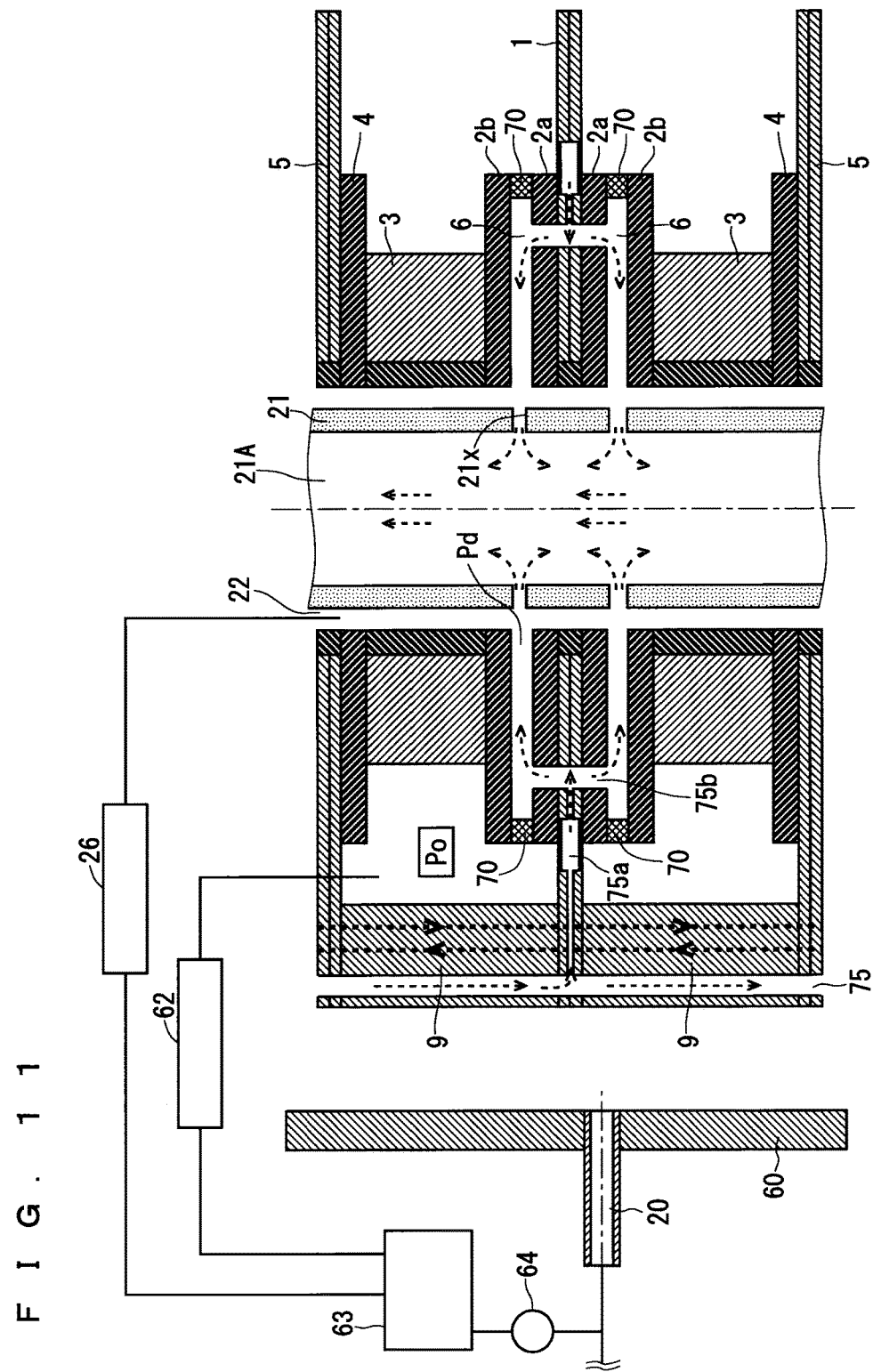
FIG. 11 A cross-sectional view showing, on an enlarged scale, a configuration of a plasma generation apparatus according to an embodiment 4.

A plasma generation apparatus according to this embodiment has the same configuration as the configuration of the plasma generation apparatus shown in FIG. 10, except that a shield 70 is additionally provided. FIG. 11 shows a configuration of the plasma generation apparatus according to this embodiment.

As shown in FIG. 11, a shield 70 is arranged in each discharge space 6. The shield 70 is a member that separates (partitions) the discharge space 6 and the outer circumferential region of the electrode cell from each other. As shown in FIG. 11, each shield 70 is in contact with the dielectric 2a and the dielectric 2b. Each of the dielectrics 2a, 2b has a circular outer shape in a plan view. The shield 70 is provided at the outer circumferential end of the circular dielectrics 2a, 2b. The shield 70 has an annular shape.

The plasma generation apparatus according to this embodiment includes the shield 70 having the above-described configuration. This can completely prevent the gases (the gas containing the active gas and the metal precursor gas or the fine metal particles) directly supplied into the discharge space 6 from spreading to the outer circumferential region of the electrode cell in the housing 16. This can also prevent the gas supplied through the gas supply part 20 into the housing 16 from entering the discharge space 6.

Accordingly, the active gas, or the like, that has been directly supplied can be led to the discharge space 6 without a reduction in its concentration. Therefore, the gas supplied through the gas supply part 20 into the housing 16 contributes only to adjustment of the pressure Po, and a high-concentration active gas can be exposed to the plasma discharge. Thus, in the invention of this embodiment, a plasma excitation gas with a higher concentration is obtained, and a more highly functional metal particle gas is obtained. This highly functional metal particle gas can be supplied to the CVD chamber 200 or the like.

<Embodiment 5>

Figure 12:
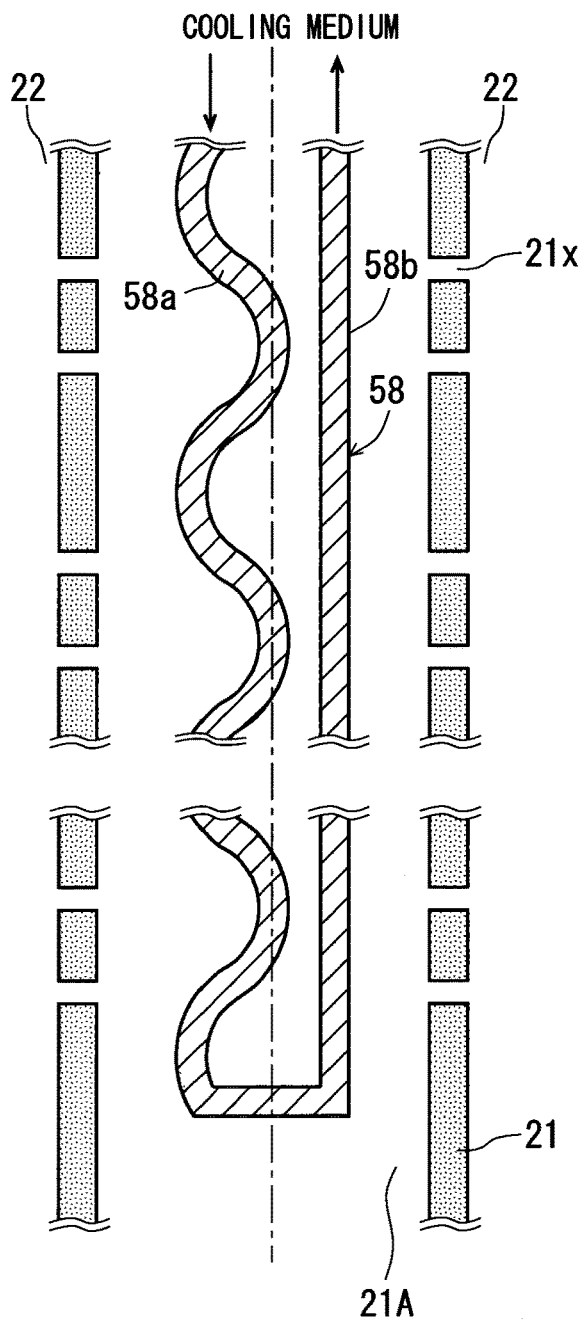
FIG. 12 A cross-sectional view showing, on an enlarged scale, a configuration of a plasma generation apparatus according to an embodiment 5.

FIG. 12 shows a configuration of a plasma generation apparatus according to this embodiment. FIG. 12 is a cross-sectional view showing, on an enlarged scale, a configuration of the inside of the hollow portion 21A of the insulating tube 21 included in the plasma generation apparatus. In the configuration shown in FIG. 12, for simplification of the drawing, the configurations surrounding the insulating tube 21 (the electrodes 1, 3, the dielectrics 2a, 2b, the discharge space 6, the insulators 1a, 3a, 5a, the high-pressure cooling plate 5, the insulating plate 4, and the like) are not illustrated.

As shown in FIG. 12, a cooling part 58 is arranged in the hollow portion 21A of the insulating tube 21. The cooling part 58 has a generally U-like outer shape along the direction in which the insulating tube 21 extends. The cooling part 58 is provided so as to extend throughout the direction in which the electrode cells are stacked such that the cooling part 58 faces all the ejection holes 21x formed in the insulating tube 21.

A cooling medium flows through the cooling part 58. More specifically, the cooling medium is supplied from the outside, enters the cooling part 58, circulates through the cooling part 58, and then is outputted to the outside. In an exemplary configuration shown in FIG. 12, a portion 58a of the cooling part 58 corresponding to a forward path for the cooling medium meanders in a S-shaped manner, and a portion 58b of the cooling part 58 corresponding to a return path for the cooling medium is linear.

As the cooling medium, for example, water whose temperature has been adjusted to a constant value in a range of about 5 to 25° C. is adoptable.

As described above, in the plasma generation apparatus according to this embodiment, the cooling part 58 is arranged in the hollow portion 21A of the insulating tube 21.

When fine metal particles serving as the source gas are supplied through the pipe passage 75, a plasma-treated particle gas is generated in the discharge space 6. The plasma-treated particle gas is led from the discharge space 6 to the hollow portion 21A through the ejection holes 21x of the insulating tube 21, and then cooled by the cooling part 58 arranged in the hollow portion 21A. As a result, separation between the plasma-modified particles αs contained in the plasma-treated particle gas and a gas component is promoted in the hollow portion 21A.

As described above, the plasma-modified particles αs generated in each discharge space 6 gather in the hollow portion 21A. Since the cooling part 58 is arranged in the hollow portion 21A, the plasma-modified particles αs are cooled and crystallization thereof is also promoted. As a result, plasma-modified particles αs each of which is a large particle are made.

<Embodiment 6>

This embodiment adopts a configuration in which a metal particle gas obtained as a result of decomposition of a metal precursor gas is directly supplied as the source gas from the outside of the housing 16 of the plasma generation apparatus 100 to the discharge space 6 (via the pipe passage 75). A configuration of a plasma generation apparatus according to this embodiment is the same as the configuration of the plasma generation apparatuses described in the embodiments, except that a precursor decomposer 54 is additionally provided. In a case where the precursor decomposer 54 is provided, a metal particle gas obtained as a result of decomposition of the metal precursor gas is supplied to the plasma generation apparatus.

As shown in FIG. 13, a metal catalyst filament 55 is arranged in the precursor decomposer 54. A heater 56 is connected to the metal catalyst filament 55. As shown in FIG. 13, a precursor gas input part 54A and a decomposition gas output part 54B are arranged in the precursor decomposer 54.

The metal catalyst filament 55 is a metal filament having a high melting point. For example, a tungsten filament is adoptable for the metal catalyst filament 55.

The heater 56 heats the metal catalyst filament 55 up to, for example, about 1200° C. A metal precursor gas is supplied through the precursor gas input part 54A into the precursor decomposer 54 in which the metal catalyst filament 55 in the heated state is arranged.

Consequently, due to a catalytic action with use of the metal catalyst filament 55, the metal precursor gas is decomposed into a metal particle gas and a gas other than the metal gas component, before it is supplied to the pipe passage 75. The metal particle gas and the gas other than it obtained as a result of the decomposition are outputted through the decomposition gas output part 54B to the pipe passage 75 arranged in the plasma generation apparatus. As a precursor decomposer 54, one that is configured to supply only the metal particle gas to the pipe passage 75 may be adoptable.

As thus far described, in the plasma generation apparatus according to this embodiment, the metal precursor gas is decomposed in the precursor decomposer 54, and then at least the metal particle gas obtained after the decomposition is supplied to the pipe passage 75.

Accordingly, the metal particle gas obtained after the decomposition is directly supplied to each discharge space 6. Therefore, in the discharge space 6, a plasma process can be directly performed on the metal particle gas, and a metal particle gas having experienced modification such as nitriding or oxidation is generated. This can produce plasma-modified particles αs having a higher quality as compared with a case where the plasma process is performed on the metal precursor gas.

While the invention has been shown and described in detail, the foregoing description is in all aspects illustrative and not restrictive. It is therefore understood that numerous modifications and variations not illustrated herein can be devised without departing from the scope of the invention.

DESCRIPTION OF THE REFERENCE NUMERALS 1 low-voltage electrode
1a, 3a, 5a insulator
2a, 2b dielectric
3 high-voltage electrode
4 insulating plate
5 high-pressure cooling plate
6 discharge space
8 fastening plate
9 connection block
PH pass-through 14b, 14c gas output flange
14S shower plate
14t ejection hole
15 electricity supply terminal
16 housing
17 AC power source
17a inverter
17b high-voltage transformer
18 processing object material
20 gas supply part
21 insulating tube
21A hollow portion
21x ejection hole
22 pipe passage
24 gas MFC
25 sub gas MFC
26, 61 auto pressure controller
27 pressure reducer
28 exhaust gas decomposition processor
30 exhaust gas output port
54 precursor decomposer
54A precursor gas input part
54B decomposition gas output part
55 metal catalyst filament
56 heater
58 cooling part
62 pressure meter
63 pressure comparator
64 valve
70 shield
75 pipe passage
75a buffer
75b ejection port
76 source gas MFC
100 plasma generation apparatus
200 CVD chamber
250 processed material collection flange
300 CVD apparatus
400 plasma-treated particle generation apparatus
αs plasma-treated particle or plasma-modified particle
γ plasma excitation gas

The invention claimed is:

1. A plasma generation apparatus, comprising:
an electrode cell;
a power source part configured to apply an AC voltage to the electrode cell; and
a housing that encloses the electrode cell,
the electrode cell comprising:
  a first electrode;
  a second electrode facing the first electrode so as to form a discharge space;
  a dielectric arranged on at least either one of a main surface of the first electrode facing the discharge space and a main surface of the second electrode facing the discharge space; and
  a pass-through formed in a central portion of the electrode cell in a plan view, the pass-through penetrating the electrode cell with respect to a facing direction in which the first electrode and the second electrode face each other,
the plasma generation apparatus further comprising:
  an insulating tube having a cylindrical shape and arranged in the pass-through, the insulating tube comprising an ejection hole that is formed in a side surface of the cylindrical shape; and
  a pipe passage configured to directly supply a source gas from the outside of the housing to the discharge space, passing through a portion in the housing other than the electrode cell and further extending into the electrode cell, wherein the pipe passage is not arranged within the discharge space,
  wherein the main surface of the first electrode has a circular shape having a hole through which the pass-through penetrates, and the pipe passage enters the first electrode along a radial direction of the circular shape and connects to a plurality of ejection ports which are formed on the main surface of the first electrode.

2. The plasma generation apparatus according to claim 1, further comprising a pressure reducer configured to reduce a pressure in a hollow portion of the insulating tube.

3. The plasma generation apparatus according to claim 1, further comprising a pressure control device configured to keep a pressure in a hollow portion of the insulating tube to a constant value, wherein
the pressure control device sets the pressure in the hollow portion to be lower than a pressure in the discharge space.

4. The plasma generation apparatus according to claim 1, further comprising a pressure control device configured to keep a pressure in the discharge space to a constant value.

5. The plasma generation apparatus according to claim 1, wherein a passage through which a liquid whose temperature has been adjusted flows is formed in the second electrode.

6. The plasma generation apparatus according to claim 1, further comprising a gas supply part that is formed in the housing, the gas supply part being configured to supply a predetermined gas from the outside of the housing to an outer circumferential region of the electrode cell in the housing.

7. The plasma generation apparatus according to claim 6, further comprising:
  a pressure control device configured to keep a pressure (Pd) of the discharge space to a constant value and measure the pressure;
  a pressure meter configured to measure a pressure (Po) in the outer circumferential region of the electrode cell in the housing; and
  a pressure comparator configured to obtain a first pressure measurement result that is a result of measurement by the pressure control device and a second pressure measurement result that is a result of measurement by the pressure meter,
  the pressure comparator being configured to perform a control for changing a control pressure of the pressure control device, a control for changing the amount of supply of the gas from the gas supply part into the housing, or both, such that the first pressure measurement result falls below the second pressure measurement result.

8. The plasma generation apparatus according to claim 7, wherein
the electrode cell further comprises a shield arranged in the discharge space, the shield partitioning the outer circumferential region of the electrode cell in the housing from the discharge space.

9. The plasma generation apparatus according to claim 6, wherein
the gas supply part is configured to supply the predetermined gas together with a rare gas.

10. The plasma generation apparatus according to claim 1, wherein
the electrode cell comprises a plurality of electrode cells, and
the electrode cells are stacked in the facing direction.

11. The plasma generation apparatus according to claim 10, further comprising a shower plate arranged at an end portion side of the insulating tube.

12. The plasma generation apparatus according to claim 1, wherein the source gas comprises an active gas.

13. The plasma generation apparatus according to claim 12, wherein the active gas is at least one selected from the group consisting of an ozone gas, an ammonia gas, and a nitrogen oxide gas.

14. The plasma generation apparatus according to claim 1, wherein the source gas comprises fine metal particles.

15. The plasma generation apparatus according to claim 14, further comprising a cooling part arranged in a hollow portion of the insulating tube.

16. The plasma generation apparatus according to claim 1, wherein the source gas comprises a metal precursor gas.

17. The plasma generation apparatus according to claim 1, further comprising a precursor decomposer configured to decompose a metal precursor gas into a metal gas and a gas other than the metal gas, wherein
at least the metal gas outputted from the precursor decomposer is supplied to the pipe passage.

18. The plasma generation apparatus according to claim 1, wherein
an inner surface of the pipe passage is made of stainless steel, and
an electropolishing process, a gold-plating process, or a passive film formation process has been performed on the inner surface.

19. The plasma generation apparatus according to claim 1, wherein the pipe passage comprises a revolving buffer.

20. A plasma-treated particle generation apparatus, comprising:
a plasma generation apparatus; and
a processed material collection flange connected to the plasma generation apparatus,
the plasma generation apparatus comprising:
an electrode cell;
a power source part configured to apply an AC voltage to the electrode cell; and
a housing that encloses the electrode cell,
the electrode cell comprising:
a first electrode;
a second electrode facing the first electrode so as to form a discharge space;
a dielectric arranged on at least either one of a main surface of the first electrode facing the discharge space and a main surface of the second electrode facing the discharge space; and
a pass-through formed in a central portion of the electrode cell in a plan view, the pass-through penetrating the electrode cell with respect to a facing direction in which the first electrode and the second electrode face each other,
the plasma generation apparatus further comprising:
an insulating tube having a cylindrical shape and arranged in the pass-through, the insulating tube comprising an ejection hole that is formed in a side surface of the cylindrical shape; and
a pipe passage configured to directly supply a source gas from the outside of the housing to the discharge space, passing through a portion in the housing other than the electrode cell and further extending into the electrode cell,
the processed material collection flange being connected to the pass-through, wherein the pipe passage is not arranged within the discharge space,
wherein the main surface of the first electrode has a circular shape having a hole through which the pass-through penetrates, and the pipe passage enters the first electrode along a radial direction of the circular shape and connects to a plurality of ejection ports which are formed on the main surface of the first electrode.

21. The plasma-treated particle generation apparatus according to claim 20, wherein
an inner surface of the pipe passage is made of stainless steel, and
an electropolishing process, a gold-plating process, or a passive film formation process has been performed on the inner surface.

22. The plasma-treated particle generation apparatus according to claim 20, wherein the pipe passage comprises a revolving buffer.

* * * * *